US012579939B2

(12) United States Patent
Zhang et al.

(10) Patent No.: US 12,579,939 B2
(45) Date of Patent: Mar. 17, 2026

(54) DISPLAY SUBSTRATE AND MANUFACTURING METHOD THEREFOR, AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Tiaomei Zhang, Beijing (CN); Wenhui Gao, Beijing (CN); Lang Liu, Beijing (CN); Hongbo Ma, Beijing (CN); Jianpeng Wu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/992,202

(22) PCT Filed: Apr. 18, 2024

(86) PCT No.: PCT/CN2024/088546
§ 371 (c)(1),
(2) Date: Jan. 8, 2025

(87) PCT Pub. No.: WO2024/234922
PCT Pub. Date: Nov. 21, 2024

(65) Prior Publication Data
US 2026/0018120 A1      Jan. 15, 2026

(30) Foreign Application Priority Data
May 17, 2023      (CN) .......................... 202310559322.9

(51) Int. Cl.
*G09G 3/32* (2016.01)
*G09G 3/3233* (2016.01)
(Continued)

(52) U.S. Cl.
CPC ....... *G09G 3/3233* (2013.01); *H10K 59/1201* (2023.02); *H10K 59/1213* (2023.02);
(Continued)

(58) Field of Classification Search
CPC .... H10D 86/00; H10D 86/01; H10D 86/0221; H10D 86/423; H10D 86/441; H10D 86/471; H10D 86/60; H10K 59/1213
See application file for complete search history.

(56) References Cited

U.S. PATENT DOCUMENTS

2007/0040772 A1* 2/2007 Kim ..................... G09G 3/3233
                                                    345/76
2011/0141160 A1* 6/2011 Nathan ................ G09G 3/3258
                                                    345/212

FOREIGN PATENT DOCUMENTS

CN          111063721 A      4/2020
CN          112331678 A      2/2021
(Continued)

OTHER PUBLICATIONS

International Search Report for PCT/CN2024/088546 Mailed Jul. 12, 2024.

*Primary Examiner* — Insa Sadio
(74) *Attorney, Agent, or Firm* — Ling Wu; Stephen Yang; Ling and Yang Intellectual Property

(57) ABSTRACT
A display substrate includes a plurality of circuit units. Each circuit unit includes a pixel driving circuit. The pixel driving circuit at least includes a first transistor, a second transistor, a third transistor, a fourth transistor, a ninth transistor, a first storage capacitor and a second storage capacitor. A second electrode of the first transistor is connected to a first electrode of the second transistor, the gate electrode of the third transistor, and a first end of the first storage capacitor, respectively. A second electrode of the fourth transistor is connected to a second electrode of the ninth transistor, a second end of the first storage capacitor, and a second end of the second storage capacitor, respectively.

19 Claims, 11 Drawing Sheets

(51) Int. Cl.
H10K 59/12 (2023.01)
H10K 59/121 (2023.01)
H10K 59/126 (2023.01)
H10K 59/131 (2023.01)

(52) U.S. Cl.
CPC ......... *H10K 59/126* (2023.02); *H10K 59/131* (2023.02); *G09G 2300/0426* (2013.01); *G09G 2300/0819* (2013.01); *G09G 2300/0852* (2013.01); *G09G 2300/0861* (2013.01); *G09G 2320/0233* (2013.01); *G09G 2320/0247* (2013.01); *G09G 2330/021* (2013.01); *G09G 2330/10* (2013.01)

(56) References Cited

FOREIGN PATENT DOCUMENTS

| CN | 113629127 A | 11/2021 |
| CN | 113889041 A | 1/2022 |
| CN | 114974082 A | 8/2022 |
| CN | 115224051 A | 10/2022 |
| CN | 115881042 A | 3/2023 |
| CN | 116097442 A | 5/2023 |
| JP | 2005164891 A | 6/2005 |
| WO | 2023039886 A1 | 3/2023 |

* cited by examiner

DISPLAY SUBSTRATE AND MANUFACTURING METHOD THEREFOR, AND DISPLAY DEVICE

CROSS-REFERENCE TO RELATED APPLICATIONS

This application is a national stage application of PCT Application No. PCT/CN2024/088546, which is filed on Apr. 18, 2024 and claims priority to Chinese Patent Application No. 202310559322.9, filed to the CNIPA on May 17, 2023 and entitled "Display Substrate and Manufacturing Method Therefor, and Display Device", contents of which should be construed as being incorporated into the present application by reference.

TECHNICAL FIELD

The present disclosure relates to, but is not limited to, the field of display technologies, and particularly to a display substrate and a manufacturing method therefor, and a display device.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, flexibility, and a low cost, etc. With constant development of display technologies, a flexible display device (Flexible Display) in which an OLED or a QLED is used as a light emitting device and signal control is performed through a Thin Film Transistor (TFT for short) has become a mainstream product in the field of display at present.

SUMMARY

The following is a summary of subject matters described herein in detail. This summary is not intended to limit the protection scope of claims.

In one aspect, the present disclosure provides a display substrate, including a plurality of circuit units forming a plurality of unit rows and a plurality of unit columns, wherein at least one circuit unit includes a pixel driving circuit, the pixel driving circuit at least includes a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor; a first electrode of the first transistor is connected to a first initial signal line, a second electrode of the first transistor is connected to a first electrode of the second transistor, a gate electrode of the third transistor, and a first end of the first storage capacitor; a first electrode of the fourth transistor is connected to a data signal line, a second electrode of the fourth transistor is connected to a second electrode of the ninth transistor, a second end of the first storage capacitor, and a second end of the second storage capacitor; a first electrode of the ninth transistor is connected to a first reference signal line; and a first end of the second storage capacitor is connected to a first power supply line; the first transistor, the second transistor, the fourth transistor, and the ninth transistor are oxide transistors, and the third transistor is a low-temperature polycrystalline silicon transistor.

In an exemplary implementation, the first transistor at least includes a first top gate electrode and a first bottom gate electrode, an orthographic projection of the first top gate electrode on a plane of the display substrate at least partially overlaps with an orthographic projection of the first bottom gate electrode on the plane of the display substrate; the first top gate electrode is in a shape of a strip extending in a unit row direction, and the first electrode of the first transistor and the second electrode of the first transistor are located on two sides of the first top gate electrode in a unit column direction.

In an exemplary implementation, the second transistor at least includes a second top gate electrode and a second bottom gate electrode, an orthographic projection of the second top gate electrode on the plane of the display substrate at least partially overlaps with an orthographic projection of the second bottom gate electrode on the plane of the display substrate; the second top gate electrode is in a shape of a strip extending in the unit column direction, and the first electrode of the second transistor and a second electrode of the second transistor are located on two sides of the second top gate electrode in the unit row direction.

In an exemplary implementation, the display substrate further includes a fifth scan signal line and a fifth scan connection line, the second top gate electrode is connected to the fifth scan signal line, the second bottom gate electrode is connected to the fifth scan connection line, an orthographic projection of the fifth scan signal line on the plane of the display substrate at least partially overlaps with an orthographic projection of the fifth scan connection line on the plane of the display substrate, and the fifth scan signal line is connected to the fifth scan connection line through a via to form a scan signal line having a double-layer structure.

In an exemplary implementation, the fourth transistor at least includes a fourth top gate electrode and a fourth bottom gate electrode, an orthographic projection of the fourth top gate electrode on the plane of the display substrate at least partially overlaps with an orthographic projection of the fourth bottom gate electrode on the plane of the display substrate; the fourth top gate electrode is in a shape of a strip extending in the unit column direction, and the first electrode of the fourth transistor and the second electrode of the fourth transistor are located on two sides of the fourth top gate electrode in the unit row direction.

In an exemplary implementation, the ninth transistor at least includes a ninth top gate electrode and a ninth bottom gate electrode, an orthographic projection of the ninth top gate electrode on the plane of the display substrate at least partially overlaps with an orthographic projection of the ninth bottom gate electrode on the plane of the display substrate; the ninth top gate electrode is in a shape of a strip extending in the unit column direction, and the first electrode of the ninth transistor and the second electrode of the ninth transistor are located on two sides of the ninth top gate electrode in the unit row direction.

In an exemplary implementation, the display substrate further includes a second scan signal line and a second scan connection line, the ninth top gate electrode is connected to the second scan signal line, the ninth bottom gate electrode is connected to the second scan connection line, an orthographic projection of the second scan signal line on the plane of the display substrate at least partially overlaps with an orthographic projection of the second scan connection line on the plane of the display substrate, and the second scan signal line is connected to the second scan connection line through a via to form a scan signal line having a double-layer structure.

In an exemplary implementation, a channel region of the fourth transistor and a channel region of the ninth transistor are on a same straight line extending in the unit row direction.

In an exemplary implementation, the first storage capacitor at least includes a first electrode plate and a third electrode plate, an orthographic projection of the first electrode plate on the plane of the display substrate at least partially overlaps with an orthographic projection of the third electrode plate on the plane of the display substrate; the second storage capacitor at least includes a second electrode plate and a fourth electrode plate, an orthographic projection of the second electrode plate on the plane of the display substrate at least partially overlaps with an orthographic projection of the fourth electrode plate on the plane of the display substrate; the first electrode plate serves as the gate electrode of the third transistor, the second electrode plate is connected to the third electrode plate, and the fourth electrode plate is connected to the first power supply line.

In an exemplary implementation, in a direction perpendicular to the display substrate, at least one circuit unit includes a first conductive layer, a second conductive layer, a third conductive layer, a fourth conductive layer, and a fifth conductive layer that are sequentially disposed on a base substrate in a direction away from the base substrate; the first electrode plate and the second electrode plate are disposed in the first conductive layer, the third electrode plate and the fourth electrode plate are disposed in the second conductive layer, the second electrode plate is connected to the third electrode plate through a connection electrode disposed in the fourth conductive layer, and the first power supply line is disposed in the fifth conductive layer.

In an exemplary implementation, an electrode plate connection line is provided on a side of the fourth electrode plate in the unit row direction, a first end of the electrode plate connection line is connected to the fourth electrode plate of the present circuit unit, and a second end of the electrode plate connection line extends in the unit row direction to be connected to the fourth electrode plate of an adjacent circuit unit, so that the fourth electrode plates of adjacent circuit units in a unit row are connected to each other to form a power supply connection line extending in the unit row direction.

In an exemplary implementation, two fourth electrode plates adjacent in the unit row direction and the electrode plate connection line form a first groove recessed in a direction away from the third electrode plate, a side of the third electrode plate close to the fourth electrode plate is provided with an electrode plate connection block, the electrode plate connection block is disposed in the first groove, and an end portion of the electrode plate connection block away from the third electrode plate is connected to the connection electrode through a via.

In an exemplary implementation, the display substrate further includes at least one first power supply connection line extending in the unit row direction and at least one reference connection line extending in the unit column direction; the first power supply line is in a shape of a line extending in the unit column direction, and the first power supply line is connected to the first power supply connection line to form a mesh structure for transmitting a first power supply signal; the first reference signal line is in a shape of a line extending in the unit row direction, and the first reference signal line is connected to the reference connection line to form a mesh structure for transmitting a reference signal.

In an exemplary implementation, the display substrate further includes at least one second power supply connection line extending in the unit row direction and at least one second power supply line extending in the unit column direction, and the second power supply line is connected to the second power supply connection line to form a mesh structure for transmitting a second power supply signal.

In an exemplary implementation, at least one circuit unit further includes a first connection electrode and a first shielding block, the first connection electrode is connected to the second electrode of the first transistor, the first electrode of the second transistor, and the first end of the first storage capacitor, the first shielding block is connected to the first power supply line, and an orthographic projection of the first shielding block on the plane of the display substrate at least partially overlaps with an orthographic projection of the first connection electrode on the plane of the display substrate.

In an exemplary implementation, at least one circuit unit further includes a second connection electrode and a second shielding block, the second connection electrode is connected to the second electrode of the fourth transistor, the second electrode of the ninth transistor, the second end of the first storage capacitor, and the second end of the second storage capacitor, the second shielding block is connected to the first power supply line, and an orthographic projection of the second shielding block on the plane of the display substrate at least partially overlaps with an orthographic projection of the second connection electrode on the plane of the display substrate.

In an exemplary implementation, at least one circuit unit further includes a third shielding block connected to the first power supply line, an orthographic projection of the third shielding block on the plane of the display substrate at least partially overlaps with an orthographic projection of the fourth transistor on the plane of the display substrate, and the orthographic projection of the third shielding block on the plane of the display substrate at least partially overlaps with an orthographic projection of the ninth transistor on the plane of the display substrate.

In another aspect, a display device is also provided in the present disclosure, and the display device includes the display substrate described above.

In a further aspect, the present disclosure also provides a manufacturing method for a display substrate, the display substrate including a plurality of circuit units forming a plurality of unit rows and a plurality of unit columns; the manufacturing method including:

forming a pixel driving circuit in at least one circuit unit, wherein the pixel driving circuit at least includes a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor; a first electrode of the first transistor is connected to a first initial signal line, a second electrode of the first transistor is connected to a first electrode of the second transistor, a gate electrode of the third transistor, and a first end of the first storage capacitor; a first electrode of the fourth transistor is connected to a data signal line, a second electrode of the fourth transistor is connected to a second electrode of the ninth transistor, a second end of the first storage capacitor, and a second end of the second storage capacitor; a first electrode of the ninth transistor is connected to a first reference signal line; and a first end of the second storage capacitor is connected to a first power supply line; the first transistor, the second transistor, the fourth transistor, and the ninth transistor are oxide transistors, and the third transistor is a low-temperature polycrystalline silicon transistor.

Other aspects of the present disclosure may be comprehended after the drawings and the detailed descriptions are read and understood.

BRIEF DESCRIPTION OF DRAWINGS

Accompanying drawings are used to provide understanding of technical solutions of the present disclosure, and form a part of the specification. The accompanying drawings and embodiments of the present disclosure are adopted to explain the technical solutions of the present disclosure, and do not form limitations on the technical solutions of the present disclosure.

DETAILED DESCRIPTION

Figure 1:
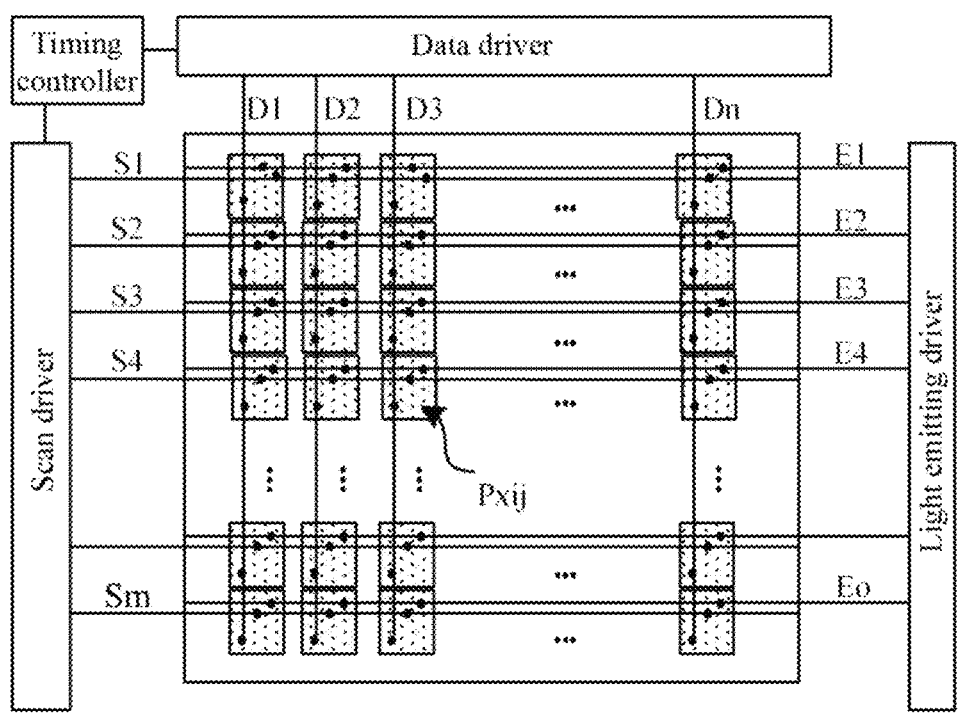
FIG. 1 is a schematic diagram of a structure of a display device.

To make objectives, technical solutions, and advantages of the present disclosure clearer, the embodiments of the present disclosure will be described in detail below with reference to the accompanying drawings. It is to be noted that implementations may be implemented in multiple different forms. Those of ordinary skills in the art may easily understand such a fact that modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals "first", "second", "third", etc., in the specification are set not to form limits in numbers but only to avoid confusion between constituent elements.

In the specification, for convenience, expressions "central", "above", "below", "front", "back", "vertical", "horizontal", "top", "bottom", "inside", "outside", etc., for indicating directional or positional relationships are used to illustrate positional relationships between the constituent elements with reference to the accompanying drawings, not to indicate or imply that involved devices or elements are required to have specific orientations or are structured and operated in the specific orientations but only to easily describe the present specification and simplify the description, and thus should not be understood as limitations on the present disclosure. The positional relationships between the constituent elements may be changed as appropriate based on a direction according to which each constituent element is described. Therefore, appropriate replacements based on situations are allowed, which is not limited to the expressions in the specification.

In the specification, unless otherwise explicitly specified and defined, terms "mounting", "coupling", and "connection" should be understood in a broad sense. For example, it may be a fixed connection, or a detachable connection, or an integral connection; it may be a mechanical connection or an electrical connection; it may be a direct connection, or an indirect connection through a middleware, or an internal communication between two elements. Those of ordinary skills in the art may understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode.

Or, the first electrode may be a source electrode, and the second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode", as well as a "source terminal" and a "drain terminal", are interchangeable in the specification.

In the specification, an "electrical connection" includes a case that constituent elements are connected together through an element with a certain electrical action. The "element with a certain electrical effect" is not particularly limited as long as electrical signals between the connected constituent elements may be sent and received. Examples of the "element with a certain electrical action" not only include an electrode and a wiring, but also include a switching element such as a transistor, a resistor, an inductor, a capacitor, another element with various functions, etc.

In the specification, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, deformation, etc.

In the present disclosure, "about" means that a boundary is not defined so strictly and numerical values within process and measurement error ranges are allowed.

FIG. 1 is a schematic diagram of a structure of a display device. As shown in FIG. 1, the display device may include a timing controller, a data driver, a scan driver, a light emitting driver, and a pixel array, wherein the timing controller is connected to the data driver, the scan driver, and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, i and j may be natural numbers, at least one sub-pixel Pxij may include a circuit unit and a light emitting unit, the circuit unit may include, at least, a pixel driving circuit connected to a scan signal line, a light emitting signal line and a data signal line, respectively. The light emitting unit may include a light emitting device connected to the pixel driving circuit of the circuit unit. In an exemplary implementation, the timing controller may provide the data signal driver with a grayscale value and a control signal which are suitable for the specification of the data signal driver, provide the scan driver with a clock signal and a scan start signal which are suitable for the specification of the scan driver, and provide the light emitting driver with a clock signal and an emission stop signal which are suitable for the specification of the light emitting driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, wherein n may be a natural number. The scan driver may generate a scan signals to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may sequentially provide an emission signal with an off-level pulse to the light emitting signal lines E1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number. In an exemplary implementation mode, the pixel array may be arranged on a display substrate.

Figure 2:
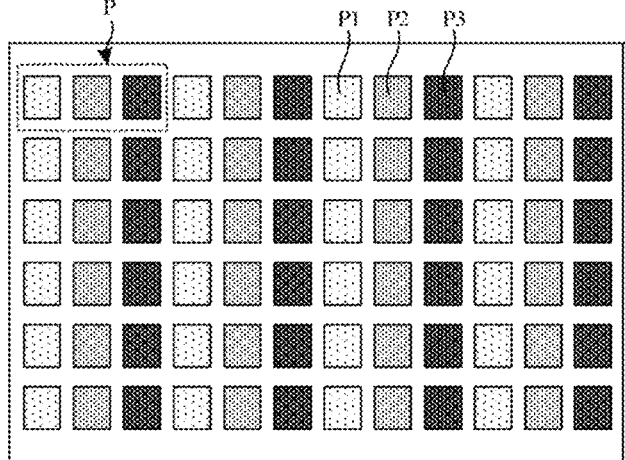
FIG. 2 is a schematic diagram of a planar structure of a display substrate.

FIG. 2 is a schematic diagram of a planar structure of a display substrate. In an exemplary implementation, the display substrate may include a display region and a bezel region located on a periphery of the display region. As shown in FIG. 2, the display region of the display substrate may include a plurality of pixel units P arranged in a matrix. At least one of the pixel units P may include a first sub-pixel P1 emitting light in a first color, a second sub-pixel P2 emitting light in a second color, and a third sub-pixel P3 emitting light in a third color. Each sub-pixel may include a circuit unit and a light emitting unit. The circuit unit may at least include a pixel driving circuit, the pixel driving circuit is connected to a scan signal line, a data signal line, and a light emitting signal line, respectively, and is configured to receive a data voltage transmitted by the data signal line and output a corresponding current to the light emitting device under control of the scan signal line and the light emitting signal line. The light emitting unit may at least include a light emitting device. The light emitting device is connected to a pixel driving circuit of a sub-pixel where the light emitting device is located. The light emitting device is configured to emit light with a corresponding brightness in response to a current output by the pixel driving circuit of the sub-pixel where the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation mode, a sub-pixel may be in a shape of a rectangle, a rhombus, a pentagon, or a hexagon. Three sub-pixels may be arranged in a manner to stand side by side horizontally, in a manner to stand side by side vertically, or in a delta-shaped arrangement, etc., which is not limited here in the present disclosure.

In an exemplary implementation mode, a pixel unit may include four sub-pixels, and the four sub-pixels may be arranged in a manner to stand side by side horizontally, in a manner to stand side by side vertically, or in a manner of forming a square, which is not limited here in the present disclosure.

Figure 3:
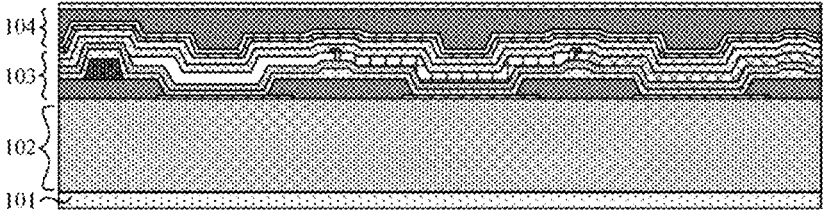
FIG. 3 is a schematic diagram of a sectional structure of a display substrate.
Figure 4:
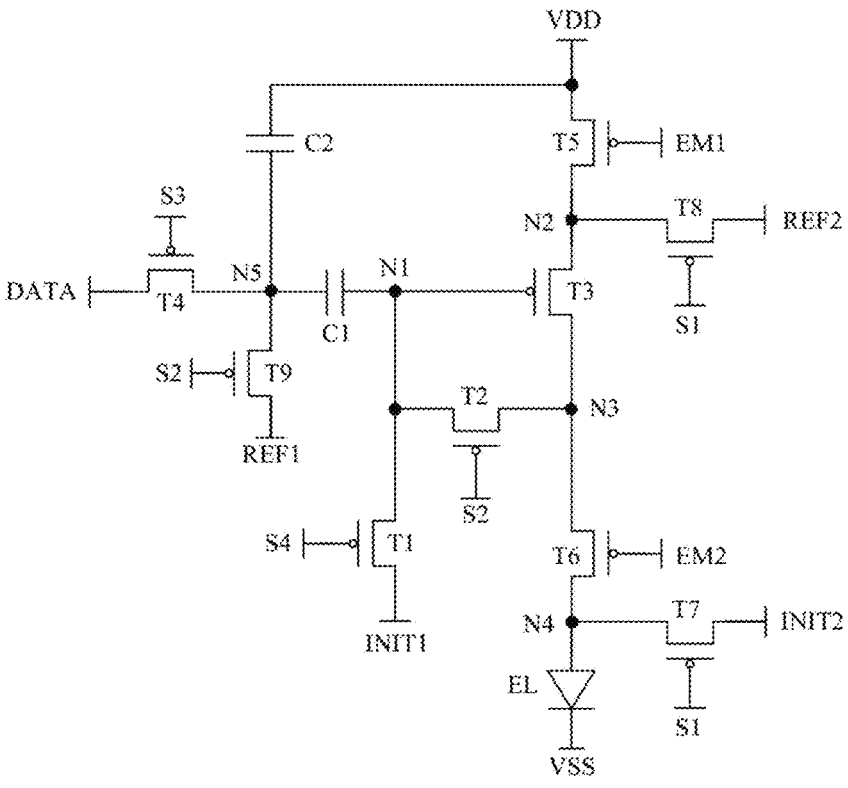
FIG. 4 is an equivalent circuit diagram of a pixel driving circuit according to an exemplary embodiment of the present disclosure.

FIG. 3 is a schematic diagram of a sectional structure of a display substrate, which illustrates a structure of three sub-pixels of the display substrate. As shown in FIG. 4, in a plane perpendicular to the display substrate, a display region of the display substrate may include a drive circuit layer 102 arranged on a base substrate 101, a light emitting structure layer 103 arranged on a side of the drive circuit layer 102 away from the base substrate 101, and an encapsulation structure layer 104 arranged on a side of the light emitting structure layer 103 away from the base substrate 101. In some possible implementation modes, the display substrate may include another film layer, such as a touch structure layer, which is not limited here in the present disclosure.

In an exemplary implementation mode, the base substrate 101 may be a flexible base substrate, or may be a rigid base substrate. The drive circuit layer 102 may include a plurality of circuit units, wherein a circuit unit may at least include a pixel driving circuit, and the pixel driving circuit may include a plurality of transistors and a storage capacitor. The light emitting structure layer 103 may include multiple light emitting units, a light emitting unit may at least include a light emitting device, and the light emitting device may include an anode, an organic emitting layer, and a cathode. The anode is connected to a pixel driving circuit. The organic emitting layer is connected to the anode. The cathode is connected to the organic emitting layer. The organic emitting layer emits light of a corresponding color under driving of the anode and the cathode. The encapsulation structure layer 104 may include a first encapsulation structure layer, a second encapsulation structure layer, and a third encapsulation structure layer that are stacked. The first encapsulation structure layer and the third encapsulation structure layer may be made of an inorganic material, the second encapsulation structure layer may be made of an organic material, and the second encapsulation structure layer is arranged between the first encapsulation structure layer and the third encapsulation structure layer to form a laminated structure of inorganic material/organic material/ inorganic material and ensure that external moisture cannot enter the light emitting structure layer 103.

In an exemplary implementation, the organic emitting layer may include an Emitting Layer (EML), and any one or more of the following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL).

An exemplary embodiment of the present disclosure provides a display substrate, including a plurality of circuit units forming a plurality of unit rows and a plurality of unit columns, wherein at least one circuit unit includes a pixel driving circuit, the pixel driving circuit at least includes a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor; a first electrode of the first transistor is connected to a first initial signal line, a second electrode of the first transistor is connected to a first electrode of the second transistor, a gate electrode of the third transistor, and a first end of the first storage capacitor; a first electrode of the fourth transistor is connected to a data signal line, a second electrode of the fourth transistor is connected to a second electrode of the ninth transistor, a second end of the first storage capacitor, and a second end of the second storage capacitor; a first electrode of the ninth transistor is connected to a first reference signal line; and a first end of the second storage capacitor is connected to a first power supply line; the first transistor, the second transistor, the fourth transistor, and the ninth transistor are oxide transistors, and the third transistor is a low-temperature polycrystalline silicon transistor.

In an exemplary implementation, the first transistor at least includes a first top gate electrode and a first bottom gate electrode, an orthographic projection of the first top gate electrode on a plane of the display substrate at least partially overlaps with an orthographic projection of the first bottom gate electrode on the plane of the display substrate; the first top gate electrode is in a shape of a strip extending in a unit row direction, and the first electrode of the first transistor and the second electrode of the first transistor are located on two sides of the first top gate electrode in a unit column direction.

In an exemplary implementation, the second transistor at least includes a second top gate electrode and a second bottom gate electrode, an orthographic projection of the second top gate electrode on the plane of the display substrate at least partially overlaps with an orthographic projection of the second bottom gate electrode on the plane of the display substrate; the second top gate electrode is in a shape of a strip extending in the unit column direction, and the first electrode of the second transistor and a second electrode of the second transistor are located on two sides of the second top gate electrode in the unit row direction.

In an exemplary implementation, the fourth transistor at least includes a fourth top gate electrode and a fourth bottom gate electrode, an orthographic projection of the fourth top gate electrode on the plane of the display substrate at least partially overlaps with an orthographic projection of the fourth bottom gate electrode on the plane of the display substrate; the fourth top gate electrode is in a shape of a strip extending in the unit column direction, and the first electrode of the fourth transistor and the second electrode of the fourth transistor are located on two sides of the fourth top gate electrode in the unit row direction.

In an exemplary implementation, the ninth transistor at least includes a ninth top gate electrode and a ninth bottom gate electrode, an orthographic projection of the ninth top gate electrode on the plane of the display substrate at least partially overlaps with an orthographic projection of the ninth bottom gate electrode on the plane of the display substrate; the ninth top gate electrode is in a shape of a strip extending in the unit column direction, and the first electrode of the ninth transistor and the second electrode of the ninth transistor are located on two sides of the ninth top gate electrode in the unit row direction.

In an exemplary implementation, a channel region of the fourth transistor and a channel region of the ninth transistor are on a same straight line extending in the unit row direction.

The display substrate in the present disclosure is illustrated with examples below through some exemplary embodiments.

FIG. 4 is an equivalent circuit diagram of a pixel driving circuit according to an exemplary embodiment of the present disclosure. In an exemplary implementation, the pixel driving circuit may be of a structure of 3TIC, 4TIC, 5TIC, 5T2C, 6TIC, 7TIC, 8TIC or 9T2C. As shown in FIG. 4, the pixel driving circuit according to the exemplary embodiment of the present disclosure may be of a 9T2C structure, and may include nine transistors (a first transistor T1 to a ninth transistor T9) and two storage capacitors (a first storage capacitor C1 and a second storage capacitor C2), and the pixel driving circuit is connected to 12 signal lines (a first scan signal line S1, a second scan signal line S2, a third scan signal line S3, a fourth scan signal line S4, a first light emitting signal line EM1, a second light emitting signal line EM2, a first initial signal line INIT1, a second initial signal line INIT2, a first reference signal line REF1, a second reference signal line REF2, a data signal line DATA and a first power supply line VDD), respectively.

In an exemplary implementation, the pixel driving circuit may include a first node N1, a second node N2, a third node N3, a fourth node N4, and a fifth node N5. The first node N1 is connected to the second electrode of the first transistor, the first electrode of the second transistor T2, the gate electrode of the third transistor T3, and the first end of the first storage capacitor C1; the second node N2 is connected to the first electrode of the third transistor T3, the second electrode of the eighth transistor T8, and the second electrode of the fifth transistor T5; the third node N3 is connected to the second electrode of the second transistor T2, the second electrode of the third transistor T3, and the first electrode of the sixth transistor T6; the fourth node N4 is connected to the second electrode of the sixth transistor T6 and the second electrode of the seventh transistor T7; and the fifth node N5 is connected to the second electrode of the fourth transistor T4, the second electrode of the ninth transistor T9, the second end of the first storage capacitor C1, and the second end of the second storage capacitor C2.

In an exemplary implementation, the first end of the first storage capacitor C1 is connected to the first node N1, the second end of the first storage capacitor C1 is connected to the fifth node N5, a first end of the second storage capacitor C2 is connected to the first power supply line VDD, and the second end of the second storage capacitor C2 is connected to the fifth node N5.

In an exemplary implementation mode, a gate electrode of the first transistor (referred to as a first initialization transistor) T1 is connected to the fourth scan signal line S4, a first electrode of the first transistor T1 is connected to the first initial signal line INIT1, and a second electrode of the first transistor is connected to the first node N1. When an ON level signal is applied to the fourth scan signal line S4, the first transistor T1 transmits a first initial voltage to the gate electrode of the third transistor T3 and the first end of the first storage capacitor C1, thereby releasing charges accumulated in the first storage capacitor C1 and achieving initialization.

In an exemplary implementation mode, a gate electrode of the second transistor (referred to as a compensation transistor) T2 is connected to the second scan signal line S2, a first electrode of the second transistor T2 is connected to the first node N1, and a second electrode of the second transistor T2 is connected to the third node N3. When an ON level signal is applied to the second scan signal line S2, the second transistor T2 enables the gate electrode of the third transistor T3 to be connected to the second electrode of the third transistor T3.

In an exemplary implementation, the gate electrode of the third transistor T3 is connected to the first node N1. That is, the gate electrode of the third transistor T3 is connected to the first end of the first storage capacitor C1, the first electrode of the third transistor T3 is connected to the second node N2, and the second electrode of the third transistor T3 is connected to the third node N3. The third transistor T3 may be referred to as a driving transistor and the third transistor T3 determines a magnitude of a drive current according to a potential difference between the gate electrode and the first electrode of the third transistor T3.

In an exemplary implementation mode, a gate electrode of the fourth transistor (referred to as a data writing transistor) T4 is connected to the third scan signal line S3, a first electrode of the fourth transistor T4 is connected to a data signal line DATA, and a second electrode of the fourth transistor T4 is connected to the fifth node N5. When an ON level signal is applied to the third scan signal line S3, the fourth transistor T4 enables a data voltage of the data signal line DATA to be input to the second end of the first storage capacitor C1 and the second end of the second storage capacitor C2.

In an exemplary implementation, a gate electrode of the fifth transistor T5 is connected to the first light emitting signal line EM1, a first electrode of the fifth transistor T5 is connected to the first power supply line VDD, and the second electrode of the fifth transistor T5 is connected to the second node N2. A gate electrode of the sixth transistor T6 is connected to the second light emitting signal line EM2, a first electrode of the sixth transistor T6 is connected to the third node N3, and a second electrode of the sixth transistor T6 is connected to the fourth node N4. When an ON level signal is applied to the first light emitting signal line EM1 and the second light emitting signal line EM2, the fifth transistor T5 and the sixth transistor T6 form a drive current path between the first power supply line VDD and the second power supply line VSS to enable the light emitting device EL to emit light.

In an exemplary implementation, a gate electrode of the seventh transistor T7 is connected to the first scan signal line S1, a first electrode of the seventh transistor T7 is connected to the second initial signal line INIT2, and the second electrode of the seventh transistor T7 is connected to the fourth node N4. When an ON level signal is applied to the first scan signal line S1, the seventh transistor T7 transmits a second initial voltage to a first electrode of the light emitting device EL, which releases charges accumulated in the first electrode of the light emitting device EL and achieves initialization.

In an exemplary implementation, a gate electrode of the eighth transistor T8 is connected to the first scan signal line S1, a first electrode of the eighth transistor T8 is connected to the second reference signal line REF2, and the second electrode of the eighth transistor T8 is connected to the second node N2. When an ON level signal is applied to the first scan signal line S1, the eighth transistor T8 transmits a second reference signal to the second node N2.

In an exemplary implementation, a gate electrode of the ninth transistor T9 is connected to the second scan signal line S2, a first electrode of the ninth transistor T9 is connected to the first reference signal line REF1, and a second electrode of the ninth transistor T9 is connected to the fifth node N5. When an ON level signal is applied to the second scan signal line S2, the ninth transistor T9 transmits a first reference signal to the fifth node N5.

In an exemplary implementation, the light emitting device EL may be an OLED including a first electrode (anode), an organic light emitting layer, and a second electrode (cathode), which are stacked, or may be a QLED including a first electrode (anode), a quantum dot light emitting layer, and a second electrode (cathode), which are stacked. The first electrode of the light emitting device EL is connected to the fourth node N4, the second electrode of the light emitting device EL is connected to the second power supply line VSS, a signal of the second power supply line VSS is a continuously supplied low-level signal, and a signal of the first power supply line VDD is a continuously supplied high-level signal.

In an exemplary implementation, the first transistor T1 to the ninth transistor T9 may be P-type transistors, or may be N-type transistors. Use of a same type of transistors in a pixel driving circuit may simplify a process flow, reduce a process difficulty of a display panel, and improve a product yield. In some possible implementation modes, the first transistor T1 to the ninth transistor T9 may include a P-type transistor and an N-type transistor.

In an exemplary implementation, for all of the first transistor T1 to the ninth transistor T9, low temperature poly silicon thin film transistors may be used, oxide thin film transistors may be used, or both of low temperature poly silicon thin film transistors and oxide thin film transistors may be used. An active layer of a low temperature poly silicon thin film transistor is made of Low Temperature Poly silicon (LTPS for short), and an active layer of an oxide thin film transistor is made of an oxide semiconductor (Oxide). The low temperature poly silicon thin film transistor has advantages, such as a high mobility and fast charging, and the oxide thin film transistor has advantages, such a low leakage current. The low temperature poly silicon thin film transistor and the oxide thin film transistor are integrated on one display substrate, that is, an LTPS+Oxide (LTPO for short) display substrate, so that advantages of the low temperature poly silicon thin film transistor and the oxide thin film transistor may be utilized, low-frequency drive may be achieved, power consumption may be reduced, and display quality may be improved.

In an exemplary implementation, a working process of the pixel driving circuit shown in FIG. 4 may at least include a first stage to a sixth stage.

In the first stage, the signals of the first scan signal line S1 and the second scan signal line S2 are turn-on signals, the signals of the other signal lines are turn-off signals, and the second transistor T2, the seventh transistor T7, the eighth transistor T8, and the ninth transistor T9 are turned on. The second transistor T2 is turned on, so that the first node N1 and the third node N3 are turned on. The ninth transistor T9 is turned on, so that the first reference signal of the first reference signal line REF1 is provided to the fifth node N5, to initialize (reset) the fifth node N5, and the third transistor T3 is turned on when the third transistor T3 is a P-type transistor. The eighth transistor T8 is turned on, so that the second reference signal of the second reference signal line REF2 is written to the second node N2, the third node N3, and the first node N1 through the turned-on eighth transistor T8, third transistor T3, and second transistor T2, respectively, to refresh the first node N1, the second node N2, and the third node N3 at a high frequency to improve hysteresis. The seventh transistor T7 is turned on, so that the second initial signal of the second initial signal line INIT2 can be written to the fourth node N4 to initialize (reset) the fourth node N4 to prevent a residual signal of a previous frame from affecting display of a present frame.

In the second stage, the signal of the fourth scan signal line S4 is a turn-on signal, the signals of the other signal lines are turn-off signals, and the first transistor T1 is turned on. The first transistor T1 is turned on, so that the first initial signal of the first initial signal line INIT1 can be provided to the first node N1 to initialize (reset) the first node N1.

In the third stage, the signals of the second scan signal line S2 and the first light emitting signal line EM1 are turn-on signals, the signals of the other signal lines are turn-off signals, and the second transistor T2, the fifth transistor T5, and the ninth transistor T9 are turned on. The second transistor T2 and the fifth transistor T5 are turned on, so that the first power supply signal of the first power supply line VDD can be provided to the second node N2 to compensate the threshold voltage of the third transistor T3. The ninth transistor T9 is turned on, so that the first reference signal of the first reference signal line REF1 is provided to the fifth node N5 to reset the fifth node N5 again.

In the fourth stage, the signal of the third scan signal line S3 is a turn-on signal, the signals of the other signal lines are turn-off signals, and the fourth transistor T4 is turned on. The fourth transistor T4 is turned on, so that the data voltage provided by the data signal line DATA is written to the fifth node N5.

In the fifth stage, the signal of the first scan signal line S1 is a turn-on signal, the signals of the other signal lines are turn-off signals, and the seventh transistor T7 and the eighth transistor T8 are turned on. The seventh transistor T7 is turned on, so that the second initial signal of the second initial signal line INIT2 can be written to the fourth node N4, to reset the fourth node N4 again. The eighth transistor T8 is turned on, so that the second reference signal of the second reference signal line REF2 is written to the second node N2, to refresh the second node N2 at a high frequency to improve flicker during screen switching.

In the sixth stage, the signals of the first light emitting signal line EM1 and the second light emitting signal line EM2 are turn-on signals, the signals of the other signal lines are turn-off signals, and the fifth transistor T5 and the sixth transistor T6 are turned on. The fifth transistor T5 and the sixth transistor T6 are turned on, so that the first power supply signal of the first power supply line VDD can provide a drive signal to the light emitting device EL through the turned-on fifth transistor T5, third transistor T3, and sixth transistor T6 to drive the light emitting device EL to emit light.

The pixel driving circuit provided in the present disclosure can effectively improve the conditions such as hysteresis of the driving transistor, and flicker during screen switching, which is beneficial to improving the display effect.

In an exemplary implementation, the display substrate according to an exemplary embodiment of the present disclosure can include a drive circuit layer arranged on a base substrate, and a light emitting structure layer arranged on a side of the drive circuit layer away from the base substrate. The drive circuit layer can at least include a plurality of circuit units, the light emitting structure layer at least includes a plurality of light emitting units, at least one circuit unit includes a pixel driving circuit, at least one light emitting unit includes a light emitting device that can at least include an anode, an organic light emitting layer, and a cathode, and the anode in the light emitting unit is connected to the pixel driving circuit in a corresponding circuit unit.

In an exemplary implementation mode, circuit units mentioned in the present disclosure refer to regions divided according to pixel driving circuits, and light emitting units mentioned in the present disclosure refer to regions divided according to light emitting devices. In an exemplary embodiment, a position of an orthographic projection of a light emitting unit on the base substrate may correspond to a position of an orthographic projection of a circuit unit on the base substrate, or a position of an orthographic projection of a light emitting unit on the base substrate may not correspond to a position of an orthographic projection of a circuit unit on the base substrate.

In an exemplary embodiment, a plurality of circuit units sequentially disposed in a first direction X are referred to as a unit row, and a plurality of circuit units sequentially disposed in a second direction Y are referred to as a unit column. A plurality of unit rows and a plurality of unit columns form an array of circuit units arranged in an array, and the first direction X intersects with the second direction Y.

Figure 5:
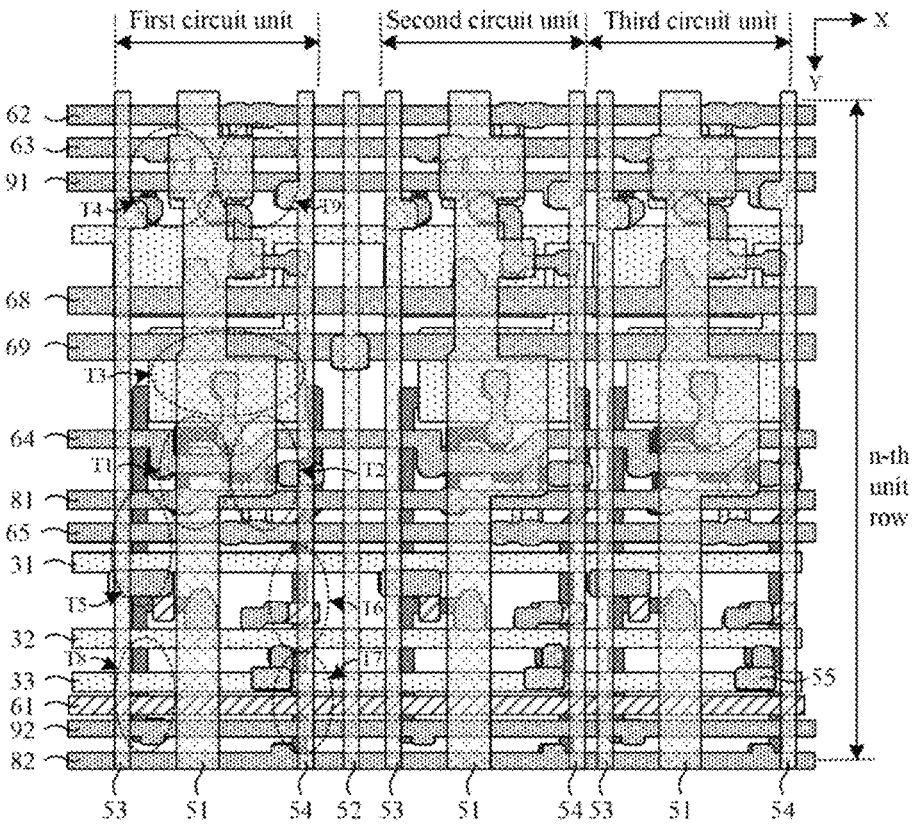
FIG. 5 is a schematic diagram of a planar structure of a display substrate according to an exemplary embodiment of the present disclosure.
Figure 6:
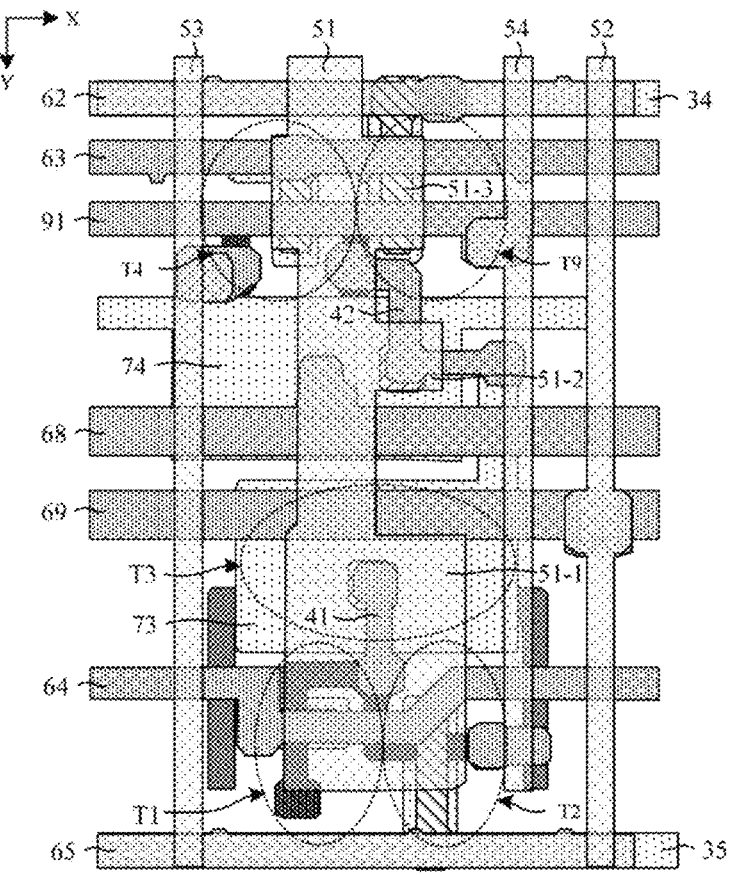
FIG. 6 is a schematic diagram of a structure of a first storage capacitor and a second storage capacitor in FIG. 5.
Figure 7:
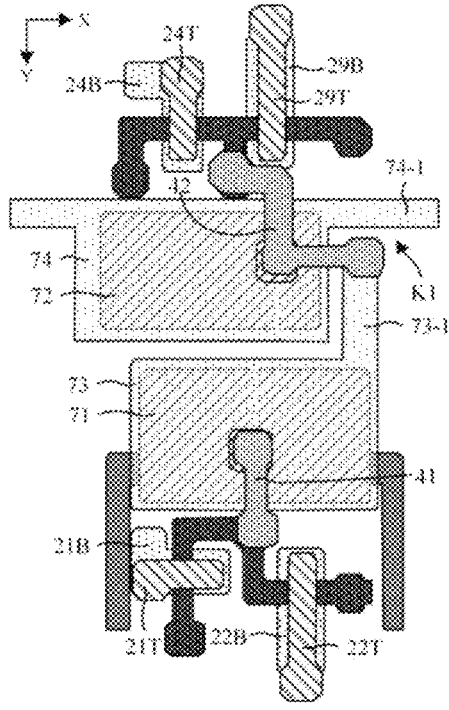
FIG. 7 is a schematic diagram of structure of oxide transistors in FIG. 5.

FIG. 5 is a schematic diagram of a planar structure of a display substrate according to an exemplary embodiment of the present disclosure, illustrating a structure of a pixel driving circuit in three circuit units (a first circuit unit, a second circuit unit, and a third circuit unit) in the display substrate, FIG. 6 is a schematic diagram of a structure of an area where a first storage capacitor and a second storage capacitor are located in FIG. 5, and FIG. 7 is a schematic diagram of structure of oxide transistors in FIG. 5.

As shown in FIG. 5, in an exemplary implementation mode, at least one pixel driving circuit may include a first storage capacitor, a second storage capacitor, and a plurality of transistors, the plurality of transistors may include a first transistor T1 and a seventh transistor T7 as initialization transistors, a second transistor T2 as a compensation transistor, a third transistor T3 as a driving transistor, a fourth transistor T4 as a data writing transistor, a fifth transistor T5 and a sixth transistor T6 as light emitting transistors, and an eighth transistor T8 and a ninth transistor T9 as reference transistors.

In an exemplary implementation, a gate electrode of the first transistor T1 is connected to a fourth scan signal line 64, a first electrode of the first transistor T1 is connected to a first initial signal line 81, and a second electrode of the first transistor T1 is connected to a first electrode of the second transistor T2, and a first electrode plate (a first end) of the first storage capacitor. A gate electrode of the second transistor T2 is connected to a fifth scan signal line 65, and a second electrode of the second transistor T2 is connected to a second electrode of the third transistor T3, and a first electrode of the sixth transistor T6, respectively. A gate electrode of the third transistor T3 serves as the first electrode plate of the first storage capacitor, and a first electrode of the third transistor T3 is connected to a second electrode of the fifth transistor T5, and a second electrode of the eighth transistor T8. A gate electrode of the fourth transistor T4 is connected to a third scan signal line 63, a first electrode of the fourth transistor T4 is connected to a data signal line 53, and a second electrode of the fourth transistor T4 is connected to a second electrode of the ninth transistor T9, a third electrode plate (a second end) of the first storage capacitor, and a second electrode plate (a second end) of the second storage capacitor. A gate electrode of the fifth transistor T5 is connected to a first light emitting signal line 31, and a first electrode of the fifth transistor T5 is connected to the first power supply line 51. A gate electrode of the sixth transistor T6 is connected to a second light emitting signal line 32, and a second electrode of the sixth transistor T6 is connected to a second electrode of the seventh transistor T7. A gate electrode of the seventh transistor T7 is connected to a first scan signal line 61, and a first electrode of the seventh transistor T7 is connected to a second initial signal line 82. A gate electrode of the eighth transistor T8 is connected to the first scan signal line 61, and a first electrode of the eighth transistor T8 is connected to the second reference signal line 92. A gate electrode of the ninth transistor T9 is connected to a second scan signal line 62, and a first electrode of the ninth transistor T9 is connected to the first reference signal line 91.

In an exemplary implementation, the first transistor T1, the second transistor T2, the fourth transistor T4, and the ninth transistor T9 are oxide transistors, and the third transistor T3, and the fifth transistor T5 to the eighth transistor T8 are low-temperature polycrystalline silicon transistors.

In an exemplary implementation, the second scan signal line 62 and the fifth scan signal line 65 transmit a same scan signal.

In an exemplary implementation, shapes of the first scan signal line 61, the second scan signal line 62, the third scan signal line 63, the fourth scan signal line 64, the fifth scan signal line 65, the first light emitting signal line 31, the second light emitting signal line 32, the first initial signal line 81, the second initial signal line 82, the first reference signal line 91, and the second reference signal line 92 may be line shapes in which a main body portion extends in the first direction X, and shapes of the first power supply line 51 and the data signal line 53 may be line shapes in which a main body portion extends in the second direction Y.

In the present disclosure, "A extends in a B direction" means that A may include a main body portion and a secondary portion connected to the main body portion, the main body portion is a line, a line segment, or a strip-shaped body, the main body portion extends in the B direction, and a length of the main body portion extends in the B direction is greater than a length of the secondary portion extends in another direction.

In an exemplary implementation, at least one circuit unit may further include an anode connection electrode 55, and the anode connection electrode 55 is connected to the second electrode of the sixth transistor T6 and the second electrode of the seventh transistor T7, and is configured to be connected to the anode of the light emitting unit.

In an exemplary implementation, at least one circuit unit may further include a repair line 33, the repair line 33 may be in a shape of a line with a main body portion extending in the first direction X, an orthographic projection of the repair line 33 on the base substrate at least partially overlaps with an orthographic projection of the anode connection electrode 55 on the base substrate, and the repair line 33 is configured such that when the display substrate has a defect of a bright spot, a signal is input, through the repair line 33, to the anode of the sub-pixel that has the defect of a bright spot, to repair the bright spot into a dark spot.

As shown in FIGS. 5, 6 and 7, in an exemplary implementation, the first storage capacitor can at least include a first electrode plate 71 and a third electrode plate 73, an orthographic projection of the third electrode plate 73 on the base substrate at least partially overlaps with an orthographic projection of the first electrode plate 71 on the base substrate, and the first electrode plate 71 and the third electrode plate 73 form the first storage capacitor. The second storage capacitor can at least include a second electrode plate 72 and a fourth electrode plate 74, an orthographic projection of the fourth electrode plate 74 on the base substrate at least partially overlaps with an orthographic projection of the second electrode plate 72 on the base substrate, and the second electrode plate 72 and the fourth electrode plate 74 form the second storage capacitor. The first electrode plate 71 may serve as the gate electrode of the third transistor T3, the second electrode plate 72 is connected to the third electrode plate 73, and the fourth electrode plate 74 is connected to the first power supply line 51.

In an exemplary implementation, on a plane perpendicular to the display substrate, the drive circuit layer can at least include a first semiconductor layer, a first conductive layer, a second conductive layer, a second semiconductor layer, a third conductive layer, a fourth conductive layer, and a fifth conductive layer, which are sequentially disposed on the base substrate in a direction away from the base substrate. Active layers of the third transistor T3, and the fifth transistor T5 to the eighth transistor T8 may be arranged in the first semiconductor layer; active layers of the first transistor T1, the second transistor T2, the fourth transistor T4, and the ninth transistor T9 may be arranged in the second semiconductor layer; the first electrode plate 71 and the second electrode plate 72 may be arranged in the first conductive layer; and the third electrode plate 73 and the fourth electrode plate 74 may be arranged in the second conductive layer. The second electrode plate 72 may be connected to the third electrode plate 73 through the second connection electrode 42 arranged in the fourth conductive layer, and the first power supply line 51 may be arranged in the fifth conductive layer.

In an exemplary implementation, at least one circuit unit may further include a first connection electrode 41, the first electrode plate 71 may be connected to the second region of the first active layer in the first transistor T1 (also the first region of the second active layer in the second transistor T2) through the first connection electrode 41, and the first connection electrode 41 may serve as the first node of the pixel driving circuit. In an exemplary embodiment of the present disclosure, the first transistor T1 and the second transistor T2 connected to the first node are oxide transistors, which can effectively reduce leakage of the first node, effectively stabilize the potential of the first node, and improve leakage of the gate electrode of the driving transistor and related display defects caused by leakage.

In an exemplary implementation, at least one circuit unit may further include a second connection electrode 42, the third electrode plate 73 may be connected to the second electrode plate 72 and the second region of the fourth active layer in the fourth transistor T4 (also the second region of the ninth active layer in the ninth transistor T9) through the second connection electrode 42, and the second connection electrode 42 may serve as the fifth node of the pixel driving circuit. In an exemplary embodiment of the present disclosure, the fourth transistor T4 and the ninth transistor T9 connected to the fifth node are oxide transistors, which can effectively reduce leakage of the fifth node, effectively stabilize the potential of the fifth node, and improve leakage of the gate electrode of the driving transistor and related display defects caused by leakage.

In an exemplary implementation, the gate electrode of the first transistor T1 may at least include a first top gate electrode 21T and a first bottom gate electrode 21B, the first bottom gate electrode 21B may be disposed in the second conductive layer, the first top gate electrode 21T may be disposed in the third conductive layer, the first top gate electrode 21T is connected to the fourth scan signal line 64, and an orthographic projection of the first top gate electrode 21T on the base substrate at least partially overlaps with an orthographic projection of the first bottom gate electrode 21B on the base substrate.

In an exemplary implementation, the first top gate electrode 21T may be in a shape of a strip extending in the first direction X (the unit row direction), such that the first electrode of the first transistor T1 and the second electrode of the first transistor T1 are respectively located on two sides of the first top gate electrode 21T in the second direction Y (the unit column direction), forming a source-drain vertical layout structure of the first transistor T1.

In an exemplary implementation, the gate electrode of the second transistor T2 may at least include a second top gate electrode 22T and a second bottom gate electrode 22B, the second bottom gate electrode 22B may be disposed in the second conductive layer, the second top gate electrode 22T may be disposed in the third conductive layer, the second top gate electrode 22T is connected to the fifth scan signal line 65, and an orthographic projection of the second top gate electrode 22T on the base substrate at least partially overlaps with an orthographic projection of the second bottom gate electrode 22B on the base substrate.

In an exemplary implementation, the second top gate electrode 22T may be in a shape of a strip extending in the second direction Y, such that the first electrode of the second transistor T2 and the second electrode of the second transistor T2 are respectively located on two sides of the second top gate electrode 22T in the first direction X, forming a source-drain lateral layout structure of the second transistor T2.

In an exemplary implementation, the gate electrode of the fourth transistor T4 may at least include a fourth top gate electrode 24T and a fourth bottom gate electrode 24B, the fourth bottom gate electrode 24B may be disposed in the second conductive layer, the fourth top gate electrode 24T may be disposed in the third conductive layer, the fourth top gate electrode 24T is connected to the third scan signal line 63, and an orthographic projection of the fourth top gate electrode 24T on the base substrate at least partially overlaps with an orthographic projection of the fourth bottom gate electrode 24B on the base substrate.

In an exemplary implementation, the fourth top gate electrode 24T may be in a shape of a strip extending in the second direction Y, such that the first electrode of the fourth transistor T4 and the second electrode of the fourth transistor T4 are respectively located on two sides of the fourth top gate electrode 24T in the first direction X, forming a source-drain lateral layout structure of the fourth transistor T4.

In an exemplary implementation, the gate electrode of the ninth transistor T9 may at least include a ninth top gate electrode 29T and a ninth bottom gate electrode 29B, the ninth bottom gate electrode 29B may be disposed in the second conductive layer, the ninth top gate electrode 29T may be disposed in the third conductive layer, the ninth top gate electrode 29T is connected to the second scan signal line 62, and an orthographic projection of the ninth top gate electrode 29T on the base substrate at least partially overlaps with an orthographic projection of the ninth bottom gate electrode 29B on the base substrate.

In an exemplary implementation, the ninth top gate electrode 29T may be in a shape of a strip extending in the second direction Y, such that the first electrode of the ninth transistor T9 and the second electrode of the ninth transistor T9 are respectively located on two sides of the ninth top gate electrode 29T in the first direction X, forming a source-drain lateral layout structure of the ninth transistor T9.

In an exemplary implementation, the channel region of the fourth transistor T4 and the channel region of the ninth transistor T9 are on a same straight line extending in the first direction X.

In an exemplary implementation, at least one circuit unit may further include a second scan connection line 34 connected to the ninth bottom gate electrode 29B. The second scan connection line 34 may be disposed in the second conductive layer, the second scan signal line 62 may be disposed in the fourth conductive layer, an orthographic projection of the second scan signal line 62 on the base substrate at least partially overlaps with an orthographic projection of the second scan connection line 34 on the base substrate, and the second scan signal line 62 may be connected to the second scan connection line 34 through a via to form a scan signal line having a double-layer structure.

In an exemplary implementation, at least one circuit unit may further include a fifth scan connection line 35 connected to the second bottom gate electrode 22B. The fifth scan connection line 35 may be disposed in the second conductive layer, the fifth scan signal line 65 may be disposed in the fourth conductive layer, an orthographic projection of the fifth scan signal line 65 on the base substrate at least partially overlaps with an orthographic projection of the fifth scan connection line 35 on the base substrate, and the fifth scan signal line 65 may be connected to the fifth scan connection line 35 through a via to form a scan signal line having a double-layer structure.

In an exemplary implementation, at least one circuit unit may further include an electrode plate connection line 74-1, the electrode plate connection line 74-1 may be arranged on a side of the fourth electrode plate 74 in the first direction X, a first end of the electrode plate connection line 74-1 is connected to the fourth electrode plate 74 of the present circuit unit, and a second end of the electrode plate connection line 74-1 extends in the first direction X to be connected to the fourth electrode plate 74 of an adjacent circuit unit, so that the fourth electrode plates 74 of adjacent circuit units in a unit row are connected to each other to form a transverse power supply connection line extending in the first direction X.

In an exemplary implementation, at least one circuit unit may further include an electrode plate connection block 73-1, two adjacent fourth electrode plates 74 in the first direction X and the electrode plate connection line 74-1 form a first groove K1 recessed in a direction away from the third electrode plate 73, a first end of the electrode plate connection block 73-1 is connected to the third electrode plate 73, a second end of the electrode plate connection block 73-1 is disposed in the first groove K1, and an end portion of the electrode plate connection block 73-1 away from the third electrode plate 73 is connected to the second connection electrode 42 through a via.

In an exemplary implementation, at least one circuit unit may further include at least one first power supply connection line 68 extending in the first direction X and at least one first power supply line 51 extending in the second direction Y, the first power supply line 51 is connected to pixel driving circuits in a plurality of circuit units, the first power supply line 51 is configured to continuously provide a high-level signal to the pixel driving circuits, and the first power supply line 51 extending in the second direction Y is connected to the first power supply connection line 68 extending in the first direction X to form a mesh structure for transmitting a first power supply signal.

In an exemplary implementation, at least one circuit unit may further include at least one second power supply connection line 69 extending in the first direction X and at least one second power supply line 52 extending in the second direction Y, the second power supply line 52 is connected to cathodes in a plurality of light emitting units, the second power supply line 52 is configured to provide a low-level signal to the cathodes, and the second power supply connection line 69 extending in the first direction X is connected to the second power supply line 52 extending in the second direction Y to form a mesh structure for transmitting a second power supply signal.

In an exemplary implementation, at least one circuit unit may further include at least one first reference signal line 91 extending in the first direction X and at least one reference connection line 54 extending in the second direction Y, the first reference signal line 91 is connected to pixel driving circuits in a plurality of circuit units, the first reference signal line 91 is configured to provide a first reference signal to the pixel driving circuits, and the first reference signal line 91 extending in the first direction X is connected to the reference connection line 54 extending in the second direction Y to form a mesh structure for transmitting a first reference signal.

In an exemplary implementation mode, the first power supply line 51 and the first power supply connection line 68 may be disposed in different conductive layers, and the first power supply line 51 and the first power supply connection line 68 may be connected through a via. The second power supply connection line 69 and the second power supply line 52 may be provided in different conductive layers, and the second power supply connection line 69 and the second power supply line 52 may be connected through a via. The first reference signal line 91 and the reference connection line 54 may be disposed in different conductive layers, and the first reference signal line 91 and the reference connection line 54 may be connected through a via.

In an exemplary implementation, the first power supply connection line 68, the second power supply connection line 69, and the first reference signal line 91 may be arranged in a same layer, i.e., the fourth conductive layer, and synchronously formed through a same patterning process, and the first power supply line 51, the second power supply line 52, and the reference connection line 54 may be arranged in a same layer, i.e., the fifth conductive layer, and synchronously formed through a same patterning process.

In an exemplary implementation, at least one circuit unit may further include a first shielding block 51-1 connected to the first power supply line 51, and an orthographic projection of the first shielding block 51-1 on the base substrate at least partially overlaps with an orthographic projection of the first connection electrode 41 on the base substrate, so as to shield an influence of other signals in the pixel driving circuit on the first node.

In an exemplary implementation, at least one circuit unit may further include a second shielding block 51-2 connected to the first power supply line 51, and an orthographic projection of the second shielding block 51-2 on the base substrate at least partially overlaps with an orthographic projection of the second connection electrode 42 on the base substrate, so as to shield an influence of other signals in the pixel driving circuit on the fifth node.

In an exemplary implementation, at least one circuit unit may further include a third shielding block 51-3 connected to the first power supply line 51, an orthographic projection of the third shielding block 51-3 on the base substrate at least partially overlaps with the orthographic projection of the fourth transistor T4 on the base substrate, and the orthographic projection of the third shielding block 51-3 on the base substrate at least partially overlaps with the orthographic projection of the ninth transistor T9 on the base substrate, so as to shield an influence of other signals in the pixel driving circuit on the fourth transistor T4 and the ninth transistor T9.

Exemplary description is made below through a manufacturing process of a display substrate. A "patterning process" mentioned in the present disclosure includes photoresist coating, mask exposure, development, etching, photoresist stripping, and the like for a metal material, an inorganic material, or a transparent conductive material, and includes organic material coating, mask exposure, development, and the like for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are provided in a same layer" in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B being within a range of an orthographic projection of A" or "an orthographic projection of A containing an orthographic projection of B" means that a boundary of the orthographic projection of B falls within a range of a boundary of the orthographic projection of A, or the boundary of the orthographic projection of A overlaps with the boundary of the orthographic projection of B.

In an exemplary implementation, three circuit units (a first circuit unit, a second circuit unit, and a third circuit unit) in an n-th unit row are taken as an example, the manufacturing process of a display substrate in the embodiment may include the following acts.

Figure 8:
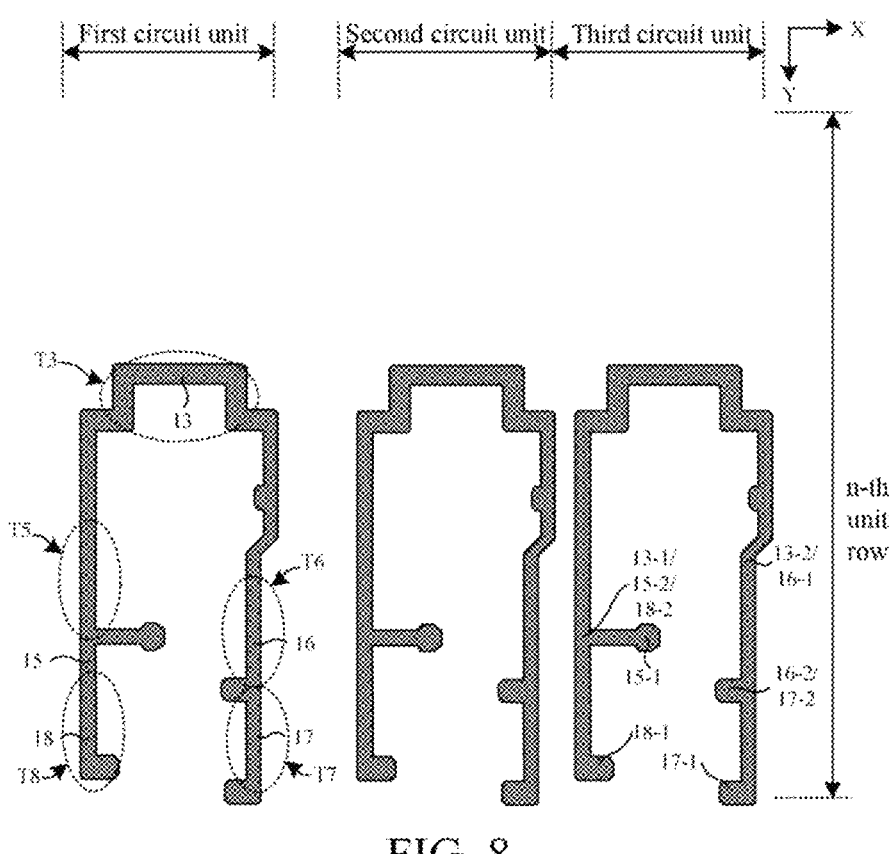
FIG. 8 is a schematic diagram of a display substrate after a pattern of a first semiconductor layer is formed according to the present disclosure.

(1) A pattern of a first semiconductor layer is formed. In an exemplary implementation, forming the pattern of the first semiconductor layer may include: sequentially depositing a first insulation thin film and a semiconductor thin film on a base substrate, and patterning the semiconductor thin film by a patterning process to form a first insulation layer covering the base substrate, and the first semiconductor layer disposed on the first insulation layer, as shown in FIG. 8.

In an exemplary implementation, the first semiconductor layer of each circuit unit in the display substrate may at least include: a third active layer 13 of the third transistor T3, a fifth active layer 15 of the fifth transistor T5, a sixth active layer 16 of the sixth transistor T6, a seventh active layer 17 of the seventh transistor T7, and an eighth active layer 18 of the eighth transistor T8, and the third active layer 13, and the fifth active layer 15 to the eighth active layer 18 may be connected to each other to form an integrated structure.

In an exemplary implementation, the fifth active layer 15 to the eighth active layer 18 in an n-th unit row may be located on a side of the third active layer 13 close to an (n+1)-th unit row. That is, the fifth active layer 15 to the eighth active layer 18 may be located on a side of the third active layer 13 in the present circuit unit in the second direction Y.

In an exemplary implementation, the fifth active layer 15 and the sixth active layer 16 may be located on a side of the third active layer 13 in the present circuit unit in the second direction Y, the eighth active layer 18 may be located on a side of the fifth active layer 15 in the present circuit unit in the second direction Y, and the seventh active layer 17 may be located on a side of the sixth active layer 16 in the present circuit unit in the second direction Y.

In an exemplary implementation, the fifth active layer 15 and the eighth active layer 18 may be located on a same side of the present circuit unit (e.g., a side in an opposite direction of the first direction X), and the sixth active layer 16 and the seventh active layer 17 may be located on a same side of the present circuit unit (e.g., a side in the first direction X).

In an exemplary implementation, the third active layer 13 may be in a shape of "C", and the fifth active layer 15, the sixth active layer 16, the seventh active layer 17, and the eighth active layer 18 may be in a shape of "I".

In an exemplary implementation, an active layer of each transistor may include a first region, a second region, and a channel region located between the first region and the second region. In an exemplary implementation, a first region 13-1 of the third active layer, a second region 15-2 of the fifth active layer, and a second region 18-2 of the eighth active layer may be connected to each other, and the first region 13-1 of the third active layer may simultaneously serve as the second region 15-2 of the fifth active layer and the second region 18-2 of the eighth active layer to form the second node N2 of the pixel driving circuit. A second region 13-2 of the third active layer and a first region 16-1 of the sixth active layer may be connected to each other, and the second region 13-2 of the third active layer may serve as the first region 16-1 of the sixth active layer. A second region 16-2 of the sixth active layer and a second region 17-2 of the seventh active layer may be connected to each other, and the second region 16-2 of the sixth active layer may serve as the second region 17-2 of the seventh active layer, forming a fourth node N4 of the pixel driving circuit. A first region 15-1 of the fifth active layer, a first region 17-1 of the seventh active layer, and a first region 18-1 of the eighth active layer can be arranged separately.

In an exemplary implementation, the first semiconductor layer may be made of poly-crystalline silicon (p-Si), i.e., the third transistor T3, and the fifth transistor T5 to the eighth transistor T8 are LTPS thin film transistors. In an exemplary implementation, patterning the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a polysilicon thin film. Subsequently, the poly silicon thin film is patterned to form the pattern of the first semiconductor layer.

Figure 9A:
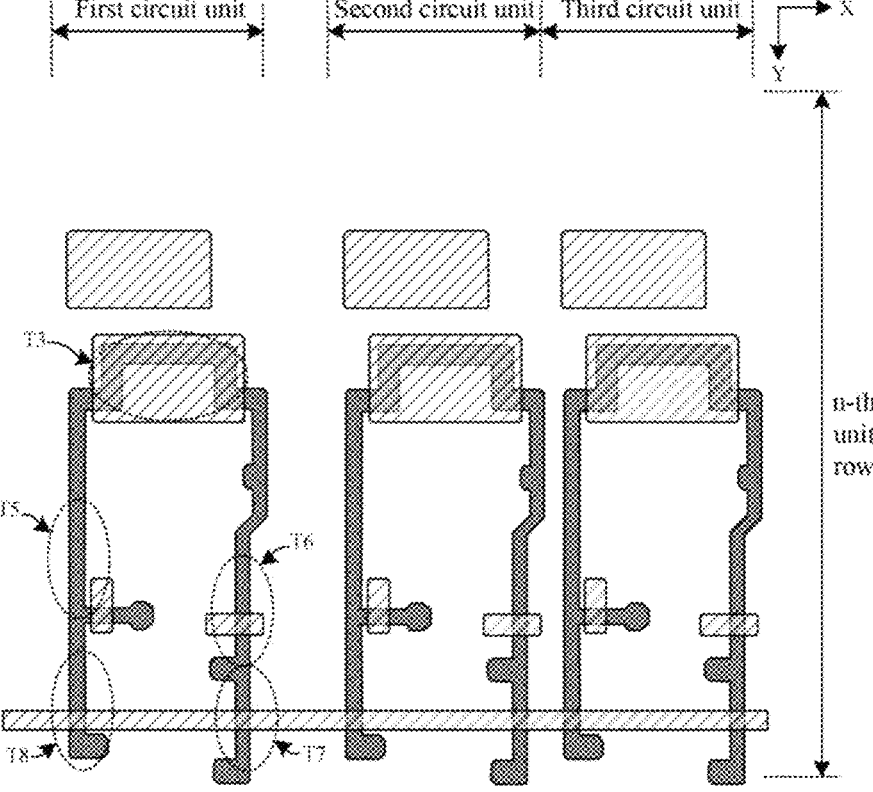
FIG. 9A and FIG. 9B are schematic diagrams of a display substrate after a pattern of a first conductive layer is formed according to the present disclosure.
Figure 9B:
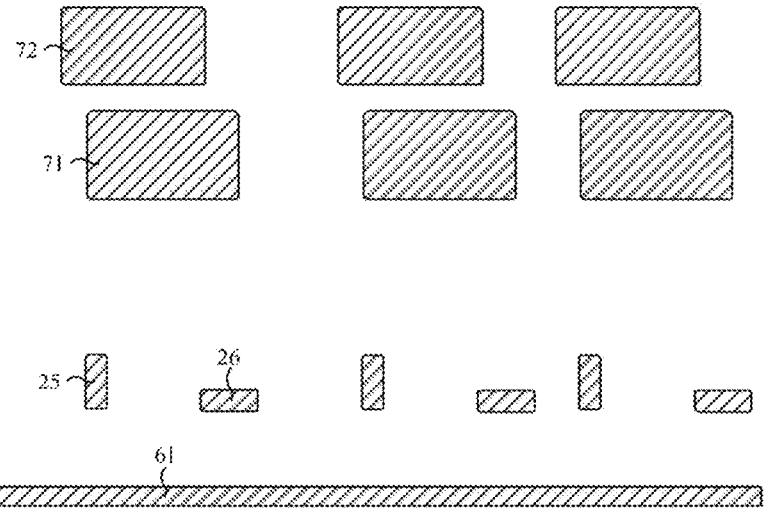

(2) Forming a pattern of a first conductive layer. In an exemplary implementation, forming the pattern of the first conductive layer may include: sequentially depositing a second insulation thin film and a first conductive thin film on the base substrate on which the aforementioned pattern is formed, and patterning the first conductive thin film through a patterning process to form a second insulation layer that covers the pattern of the first semiconductor layer and the pattern of the first conductive layer disposed on the second insulation layer, as shown in FIG. 9A and FIG. 9B, FIG. 9B being a schematic diagram of the first conductive layer in FIG. 9A. In an exemplary implementation mode, the first conductive layer may be referred to as a first gate metal (GATE1) layer.

In an exemplary implementation, the pattern of the first conductive layer of each circuit unit in the display substrate at least includes: a fifth gate electrode 25, a sixth gate electrode 26, a first scan signal line 61, a first electrode plate 71 of a first storage capacitor, and a second electrode plate 72 of a second storage capacitor.

In an exemplary implementation, the first scan signal line 61 may be in a shape of a line with the main body portion extending in the first direction X, a region where the first scan signal line 61 overlaps with the seventh active layer may serve as the gate electrode of the seventh transistor T7, and a region where the first scan signal line 61 overlaps with the eighth active layer may serve as the gate electrode of the eighth transistor T8.

In an exemplary implementation, the fifth gate electrode 25 may be in a shape of a strip extending in the second direction Y, and may be located on a side of the first scan signal line 61 in an opposite direction of the second direction Y, and a region where the fifth gate electrode 25 overlaps with the fifth active layer may serve as the gate electrode of the fifth transistor T5.

In an exemplary implementation, the sixth gate electrode 26 may be in a shape of a strip extending in the first direction X, and may be located on a side of the first scan signal line 61 in an opposite direction of the second direction Y, and a region where the sixth gate electrode 26 overlaps with the sixth active layer may serve as the gate electrode of the sixth transistor T6.

In an exemplary implementation, a shape of the first electrode plate 71 of the first storage capacitor may be a shape of rectangle in which corners of the rectangle may be chamfered, an orthographic projection of the first electrode plate 71 on the base substrate is overlapped, at least partially, with an orthographic projection of the third active layer of the third transistor T3 on the base substrate, and the first electrode plate 71 may serve as a lower plate of the first storage capacitor and a gate electrode of the third transistor T3 at the same time.

In an exemplary implementation, the second electrode plate 72 of the second storage capacitor may be in a shape of a rectangle whose corners may be chamfered, and may be located on a side of the first electrode plate 71 in an opposite direction of the second direction Y, and an orthographic projection of the second electrode plate 72 on the base substrate does not overlap with an orthographic projection of the first semiconductor layer on the base substrate. In an exemplary implementation, the second electrode plate 72 may serve as a lower plate of the second storage capacitor.

In an exemplary implementation, after the pattern of the first conductive layer is formed, a conductorization treatment may be performed on the first semiconductor layer by using the first conductive layer as a shield. The first semiconductor layer, in a region shielded by the first conductive layer, forms channel regions of the third transistor T3, and the fifth transistor T5 to the eighth transistor T8, and the first semiconductor layer, in a region not shielded by the first conductive layer, is made to be conductive, i.e., first regions and second regions of the third transistor T3, and the fifth transistor T5 to the eighth transistor T8 are all made to be conductive.

Figure 10A:
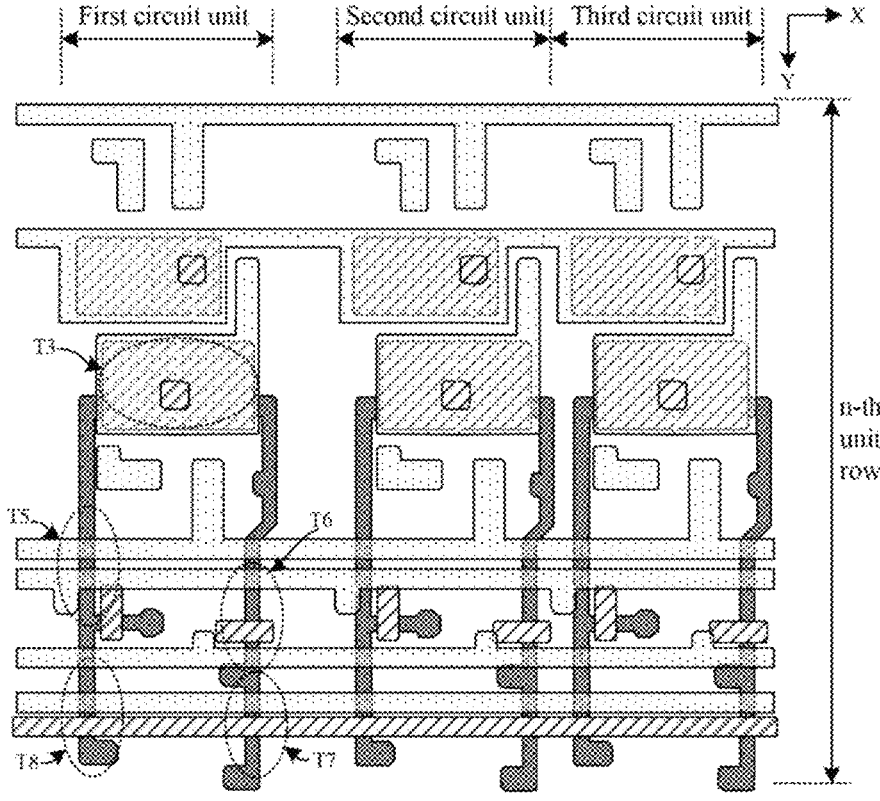
FIGS. 10A and 10B are schematic diagrams of a display substrate after a pattern of a second conductive layer is formed according to the present disclosure.
Figure 10B:
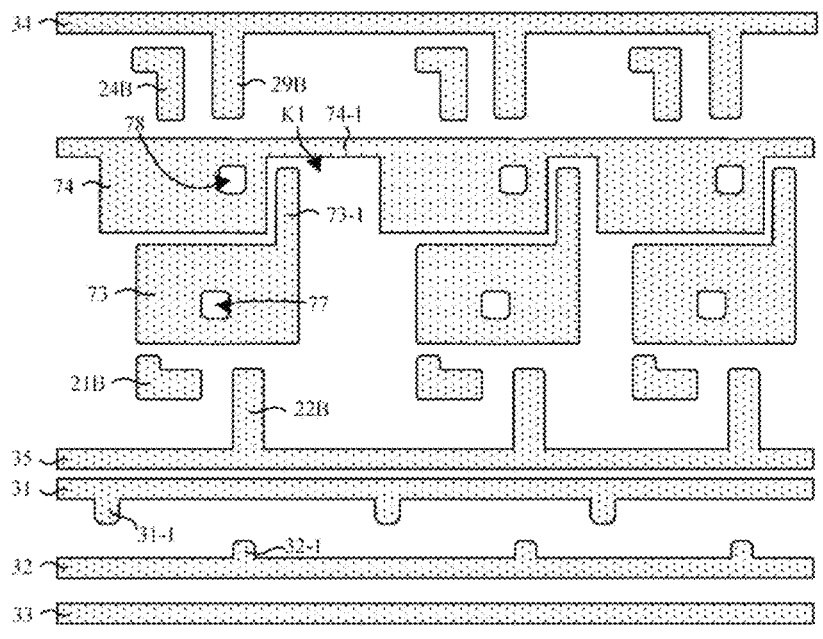

(3) Forming a pattern of a second conductive layer. In an exemplary implementation, forming the pattern of the second conductive layer may include: a third insulation thin film and a second conductive thin film are sequentially deposited on the base substrate on which the aforementioned patterns are formed, and the second conductive thin film is patterned through a patterning process to form a third insulation layer that covers the first conductive layer, and a pattern of a second conductive layer disposed on the third insulation layer, as shown in FIGS. 10A and 10B, wherein FIG. 10B is a schematic diagram of the second conductive layer in FIG. 10A. In an exemplary implementation mode, the second conductive layer may be referred to as a second gate metal (GATE2) layer.

In an exemplary implementation, the pattern of the second conductive layer of each circuit unit in the display substrate at least includes: a first bottom gate electrode 21B, a second bottom gate electrode 22B, a fourth bottom gate electrode 24B, a ninth bottom gate electrode 29B, a first light emitting signal line 31, a second light emitting signal line 32, a repair line 33, a second scan connection line 34, a fifth scan connection line 35, a third electrode plate 73 of the first storage capacitor, and a fourth electrode plate 74 of the second storage capacitor.

In an exemplary implementation, the first bottom gate electrode 21B may be in a shape of "L", and may be located on a side of the first electrode plate 71 in the second direction Y. The first bottom gate electrode 21B is configured as the bottom gate electrode of the first transistor T1 on the one hand, and is configured as a shielding layer of the first transistor T1 on the other hand, to shield the channel region of the first transistor T1, thereby reducing the influence of light on the electrical characteristics of the first transistor T1.

In an exemplary implementation, the second bottom gate electrode 22B may be in a shape of a strip extending in the second direction Y, and may be located on a side of the first electrode plate 71 in the second direction Y. The second bottom gate electrode 22B is configured as the bottom gate electrode of the second transistor T2 on the one hand, and is configured as a shielding layer of the second transistor T2 on the other hand, to shield the channel region of the second transistor T2, thereby reducing the influence of light on the electrical characteristics of the second transistor T2.

In an exemplary implementation, the fourth bottom gate electrode 24B may be in a shape of "L", and may be located on a side of the second electrode plate 72 in an opposite direction of the second direction Y. The fourth bottom gate electrode 24B is configured as the bottom gate electrode of the fourth transistor T4 on the one hand, and is configured as a shielding layer of the fourth transistor T4 on the other hand, to shield the channel region of the fourth transistor T4, thereby reducing the influence of light on the electrical characteristics of the fourth transistor T4.

In an exemplary implementation, the ninth bottom gate electrode 29B may be in a shape of a strip extending in the second direction Y, and may be located on a side of the second electrode plate 72 in an opposite direction of the second direction Y. The ninth bottom gate electrode 29B is configured as the bottom gate electrode of the ninth transistor T9 on the one hand, and is configured as a shielding layer of the ninth transistor T9 on the other hand, to shield the channel region of the ninth transistor T9, thereby reducing the influence of light on the electrical characteristics of the ninth transistor T9.

In an exemplary implementation, the first light emitting signal line 31, the second light emitting signal line 32, the repair line 33, the second scan connection line 34, and the fifth scan connection line 35 may be in a shape of a line with the main body portion extending in the first direction X, the first light emitting signal line 31, the second light emitting signal line 32, the repair line 33, and the fifth scan connection line 35 may be located between the first bottom gate electrode 21B and the first scan signal line 61, and the second scan connection line 34 may be located on a side of the fourth bottom gate electrode 24B in an opposite direction of the second direction Y.

In an exemplary implementation, the fifth scan connection line 35 may be located on a side of the first bottom gate electrode 21B in the second direction Y, the first light emitting signal line 31 may be located on a side of the fifth scan connection line 35 in the second direction Y, the second light emitting signal line 32 may be located on a side of the first initial signal line 81 in the second direction Y, and the repair line 33 may be located on a side of the second light emitting signal line 32 in the second direction Y, i.e., the first light emitting signal line 31 and the second light emitting signal line 32 may be located between the fifth scan connection line 35 and the repair line 33.

In an exemplary implementation, the second scan connection line 34 is connected to the ninth bottom gate electrode 29B of each circuit unit, thus realizing connection of the second scan connection line 34 to the bottom gate electrode of the ninth transistor T9. In an exemplary implementation, the second scan connection line 34 and a plurality of ninth bottom gate electrodes 29B may be connected to each other to form an integrated structure.

In an exemplary implementation, the fifth scan connection line 35 is connected to the second bottom gate electrode 22B of each circuit unit, thus realizing connection of the fifth scan connection line 35 to the bottom gate electrode of the second transistor T2. In an exemplary implementation, the fifth scan connection line 35 and a plurality of second bottom gate electrodes 22B may be connected to each other to form an integrated structure.

In an exemplary implementation, a first light emitting connection block 31-1 is provided on a side of the first light emitting signal line 31 close to the second light emitting signal line 32, the first light emitting connection block 31-1 may be provided in each circuit unit, a first end of the first light emitting connection block 31-1 is connected to the first light emitting signal line 31, a second end of the first light emitting connection block 31-1 extends in a direction toward the second light emitting signal line 32, and the first light emitting connection block 31-1 is configured to connect with the fifth gate electrode 25 through the seventh connection electrode formed later. In an exemplary implementation mode, the first light emitting signal line 31 and a plurality of first light emitting connection blocks 31-1 may be of an interconnected integral structure.

In an exemplary implementation, a second light emitting connection block 32-1 is provided on a side of the second light emitting signal line 32 close to the first light emitting signal line 31. The second light emitting connection block 32-1 may be disposed in each circuit unit, a first end of the second light emitting connection block 32-1 is connected to the second light emitting signal line 32, a second end of the second light emitting connection block 32-1 extends in a direction toward the first light emitting signal line 31, and the second light emitting connection block 32-1 is configured to connect with the sixth gate electrode 26 through an eighth connection electrode formed later. In an exemplary implementation, the second light emitting signal line 32 and a plurality of light emitting connection blocks 32-1 may be connected to each other to form an integral structure.

In an exemplary implementation, the third electrode plate 73 of the first storage capacitor may have a contour in a shape of a rectangle whose corners may be chamfered, and may be located between the second scan connection line 34 and the fifth scan connection line 35, an orthographic projection of the third electrode plate 73 on the base substrate at least partially overlaps with an orthographic projection of the first electrode plate 71 on the base substrate, the third electrode plate 73 may serve as an upper electrode plate of the first storage capacitor, and the first electrode plate 71 and the third electrode plate 73 form the first storage capacitor of the pixel driving circuit.

In an exemplary implementation, the fourth electrode plate 74 of the second storage capacitor may have a contour in a shape of a rectangle whose corners may be chamfered, and may be located between the second scan connection line 34 and the third electrode plate 73, an orthographic projection of the fourth electrode plate 74 on the base substrate at least partially overlaps with an orthographic projection of the second electrode plate 72 on the base substrate, the fourth electrode plate 74 may serve as an upper electrode plate of the second storage capacitor, and the second electrode plate 72 and the fourth electrode plate 74 form the second storage capacitor of the pixel driving circuit.

In an exemplary implementation mode, the third electrode plate 73 of each circuit unit is provided with a first opening 77, the first opening 77 may be located in a partial region of the third electrode plate 73, the first opening 77 may be rectangular or circular, etc., so that the third electrode plate 73 forms an annular structure. The first opening 77 exposes a third insulation layer covering the first electrode plate 71, and an orthographic projection of the first electrode plate 71 on the base substrate contains an orthographic projection of the first opening 77 on the base substrate. In an exemplary implementation, the first opening 77 is configured to accommodate a tenth via formed later, and the tenth via is located within the first opening 77 and exposes the first electrode plate 71, so that a first connection electrode formed later is connected to the first electrode plate 71.

In an exemplary implementation mode, the fourth electrode plate 74 of each circuit unit is provided with a second opening 78, the second opening 78 may be located in a partial region of the fourth electrode plate 74, the second opening 78 may be rectangular or circular, etc., so that the fourth electrode plate 74 forms an annular structure. The second opening 78 exposes a third insulation layer covering the second electrode plate 72, and an orthographic projection of the second electrode plate 72 on the base substrate contains an orthographic projection of the second opening 78 on the base substrate. In an exemplary implementation, the second opening 78 is configured to accommodate an eleventh via formed later, and the eleventh via is located within the second opening 78 and exposes the second electrode plate 72, so that the second connection electrode formed later is connected to the second electrode plate 72.

In an exemplary implementation, an electrode plate connection block 73-1 may be provided on a side of the third electrode plate 73 close to the fourth electrode plate 74, the electrode plate connection block 73-1 may be in a shape of a strip extending in the second direction Y, the electrode plate connection block 73-1 may be provided in each circuit unit, a first end of the electrode plate connection block 73-1 is connected to the third electrode plate 73, and a second end of the electrode plate connection block 73-1 extends in a direction away from the third electrode plate 73. In an exemplary implementation, the electrode plate connection block 73-1 is configured to be connected to the first electrode plate 71 and the second region of the fourth active layer (also the second region of the ninth active layer) through a second connection electrode formed subsequently.

In an exemplary implementation mode, an electrode plate connection line 74-1 may be provided at a side of the fourth electrode plate 74 in the first direction X or at a side in an opposite direction of the first direction X, a first end of the electrode plate connection line 74-1 is connected to the fourth electrode plate 74 of the present circuit unit, and a second end of the electrode plate connection line 74-1 extends in the first direction X or an opposite direction of the first direction X, and is connected to a fourth electrode plate 74 of an adjacent circuit unit, so that fourth electrode plates 74 of adjacent circuit units on a unit row are connected to each other. In an exemplary implementation mode, a plurality of fourth electrode plates 74 and a plurality of electrode plate connection lines 74-1 arranged at intervals in the first direction X may be of an interconnected integral structure. Since the fourth electrode plate 74 is connected to a first power supply line formed subsequently, the fourth electrode plates 74 in an integrated structure of a plurality of circuit units may be reused as a transverse power supply connection line extending in the first direction X, realizing a structure in which the first power supply signal can pass through transversely. This not only can ensure that the plurality of fourth electrode plates in a unit row have a same potential, but also can reduce a voltage drop of the first power supply signal, which is beneficial to improving uniformity of the panel, avoiding poor display of the display substrate, and ensuring the display effect of the display substrate.

In an exemplary implementation, edges, close to each other, of two adjacent fourth electrode plates 74 in the first direction X and edges of two electrode plate connection lines 74-1 may form a first groove K1. The first groove K1 is configured to accommodate the electrode plate connection block 73-1, and the electrode plate connection block 73-1 extends in a direction towards the electrode plate connection line 74-1 in the first groove K1, which can make a twelfth via formed subsequently as upper as possible and as close to the second region of the fourth active layer (also the second region of the ninth active layer) formed subsequently as possible. The twelfth via is configured such that a second connection electrode formed subsequently is connected to the electrode plate connection block 73-1 through the via, and the second connection electrode is simultaneously connected to the second region of the fourth active layer (also the second region of the ninth active layer) through a via, which can reduce an extension length of the second connection electrode.

In an exemplary implementation, the repair line 33 may serve as a pre-set repair signal line, and is configured such that when the display substrate has a defect of a bright spot, a signal is input, through the repair line 33, to the anode of the sub-pixel that has the defect of a bright spot, to repair the bright spot into a dark spot.

Figure 11A:
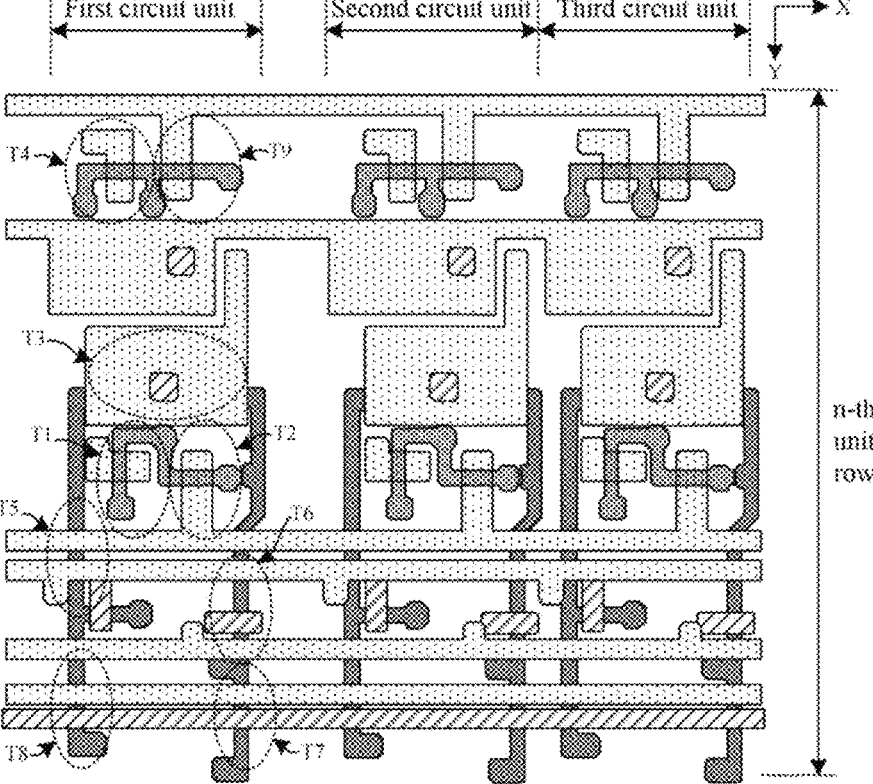
FIG. 11A and FIG. 11B are schematic diagrams of a display substrate after a pattern of a second semiconductor layer is formed according to the present disclosure.
Figures 11B, 12A:
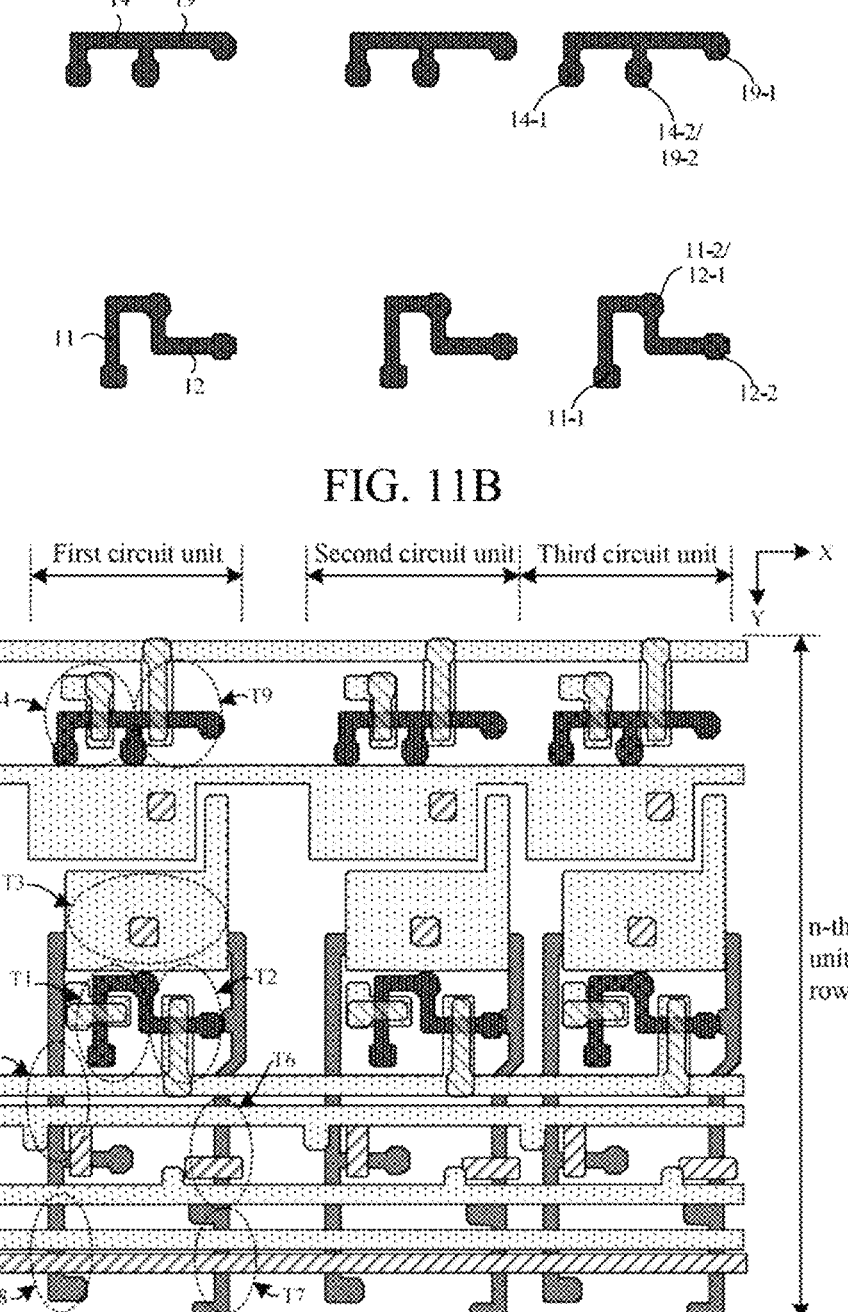
FIG. 12A and FIG. 12B are schematic diagrams of a display substrate after a pattern of a third conductive layer is formed according to the present disclosure.

(4) A pattern of a second semiconductor layer is formed. In an exemplary implementation, forming the pattern of the second semiconductor layer may include: sequentially depositing a fourth insulation thin film and a second semiconductor thin film on the base substrate on which aforementioned patterns are formed, and patterning the second semiconductor thin film through a patterning process to form a fourth insulation layer covering the second conductive layer and the pattern of the second semiconductor layer disposed on the fourth insulation layer, as shown in FIG. 11A and FIG. 11B, FIG. 11B being a schematic diagram of the second semiconductor layer in FIG. 11A.

In an exemplary implementation, the pattern of the second semiconductor layer of each circuit unit in the display substrate at least includes: a first active layer 11 of the first transistor T1, a second active layer 12 of the second transistor T2, a fourth active layer 14 of the fourth transistor T4, and a ninth active layer 19 of the ninth transistor T9. The first active layer 11 and the second active layer 12 are connected to each other to from an integrated structure, and the fourth active layer 14 and the ninth active layer 19 are connected to each other to form an integrated structure.

In an exemplary implementation, the fourth active layer 14 and the ninth active layer 19 may be located on a side of the fourth electrode plate 14 away from the third electrode plate 13, and the first active layer 11 and the second active layer 12 may be located on a side of the third electrode plate 13 away from the fourth electrode plate 14.

In an exemplary implementation, the first active layer 11, the second active layer 12, the fourth active layer 14, and the ninth active layer 19 may be in a shape of "L"; the second region 11-2 of the first active layer and the first region 12-1 of the second active layer may be connected to each other; the second region 11-2 of the first active layer may serve as the first region 12-1 of the second active layer; the second region 14-2 of the fourth active layer and the second region 19-2 of the ninth active layer may be connected to each other; the second region 14-2 of the fourth active layer may serve as the second region 19-2 of the ninth active layer; and the first region 11-1 of the first active layer, the second region 12-2 of the second active layer, the first region 14-1 of the fourth active layer, and the first region 19-1 of the ninth active layer may be arranged separately.

In an exemplary implementation, the second semiconductor layer may be made of oxides, that is, the first transistor T1, the second transistor T2, the fourth transistor T4, and the ninth transistor T9 are oxide transistors. In an exemplary implementation, the oxide may be any one or more of Indium Gallium Zinc Oxide (InGaZnO), Indium Gallium Zinc Oxynitride (InGaZnON), Zinc Oxide (ZnO), Zinc Oxynitride (ZnON), Zinc Tin Oxide (ZnSnO), Cadmium Tin Oxide (CdSnO), Gallium Tin Oxide (GaSnO), Titanium Tin Oxide (TiSnO), Copper Aluminum Oxide (CuAlO), Strontium Copper Oxide (SrCuO), Lanthanum Copper Oxysulfide (LaCuOS), Gallium Nitride (GaN), Indium Gallium Nitride (InGaN), Aluminum Gallium Nitride (AlGaN), and Indium Gallium Aluminum Nitride (InGaAlN). In some possible implementations, the second semiconductor thin film may be made of Indium Gallium Zinc Oxide (IGZO), an electron mobility of Indium Gallium Zinc Oxide (IGZO) is higher than an electron mobility of amorphous silicon.

Figure 12B:
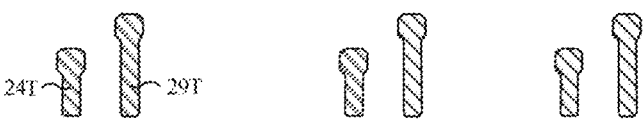
Figure 12B:
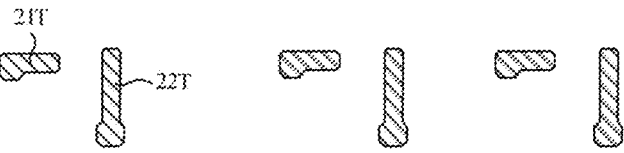

(5) Forming a pattern of a third conductive layer. In an exemplary implementation, forming the pattern of the third conductive layer may include: sequentially depositing a fifth insulation thin film and a third conductive thin film on the base substrate on which aforementioned patterns are formed, and patterning the third conductive thin film using a patterning process to form a fifth insulation layer covering the second semiconductor layer, and the pattern of the third conductive layer disposed on the fifth insulation layer, as shown in FIG. 12A and FIG. 12B, FIG. 12B being a schematic diagram of the third conductive layer in FIG. 12A. In an exemplary implementation, the third conductive layer may be referred to as a third gate metal (GATE3) layer.

In an exemplary implementation, the pattern of the third conductive layer of each circuit unit in the display substrate at least includes: a first top gate electrode 21T, a second top gate electrode 22T, a fourth top gate electrode 24T, and a ninth top gate electrode 29T.

In an exemplary implementation, the first top gate electrode 21T may be in a shape of a strip extending in the first direction X, and may be located on a side of the third electrode plate 73 in the second direction Y, an orthographic projection of the first top gate electrode 21T on the base substrate at least partially overlaps with an orthographic projection of the first bottom gate electrode 21B on the base substrate, and the first top gate electrode 21T is configured as the top gate electrode of the first transistor T1.

In an exemplary implementation, the second top gate electrode 22T may be in a shape of a strip extending in the second direction Y, and may be located on a side of the first electrode plate 71 in the second direction Y, an orthographic projection of the second top gate electrode 22T on the base substrate at least partially overlaps with an orthographic projection of the second bottom gate electrode 22B on the base substrate, and the second top gate electrode 22T is configured as the top gate electrode of the second transistor T2.

In an exemplary implementation, the fourth top gate electrode 24T may be in a shape of a strip extending in the second direction Y, and may be located on a side of the fourth electrode plate 74 in an opposite direction of the second direction Y, an orthographic projection of the fourth top gate electrode 24T on the base substrate at least partially overlaps with an orthographic projection of the fourth bottom gate electrode 24B on the base substrate, and the fourth top gate electrode 24T is configured as the top gate electrode of the fourth transistor T4.

In an exemplary implementation, the ninth top gate electrode 29T may be in a shape of a strip extending in the second direction Y, and may be located on a side of the fourth electrode plate 74 in an opposite direction of the second direction Y, an orthographic projection of the ninth top gate electrode 29T on the base substrate at least partially overlaps with an orthographic projection of the ninth bottom gate electrode 29B on the base substrate, and the ninth top gate electrode 29T is configured as the top gate electrode of the ninth transistor T9.

In an exemplary implementation, the first top gate electrode 21T is in a shape of a horizontally disposed strip, so that the first region and the second region of the first active layer are respectively located on the upper and lower sides of the first top gate electrode 21T, forming a source-drain vertical layout structure of the first transistor T1. The second top gate electrode 22T is in a shape of a vertically disposed strip, so that the first region and the second region of the second active layer are respectively located on the left and right sides of the second top gate electrode 22T, forming a source-drain lateral layout structure of the second transistor T2. The second top gate electrode 22T is located on a side of the first top gate electrode 21T in the first direction X, so that the second region of the first active layer and the first region of the second active layer connected to each other are located between the first top gate electrode 21T and the second top gate electrode 22T, which facilitates the connection of the second region of the first active layer and the first region of the second active layer to the first node. In the present disclosure, the first transistor T1 having a source-drain vertical layout structure and the second transistor T2 having a source-drain lateral layout structure are provided, and through a flexible design of the transistor layout direction, the layout space can be optimized, and the occupied area of the pixel driving circuit can be reduced, which is beneficial to realizing high resolution.

In an exemplary implementation, the fourth top gate electrode 24T and the ninth top gate electrode 29T are in a shape of a vertically disposed strip, so that the first region and the second region of the fourth active layer are respectively located on the left and right sides of the fourth top gate electrode 24T, and the first region and the second region of the ninth active layer are respectively located on the left and right sides of the ninth top gate electrode 29T, forming a source-drain lateral layout structure of the fourth transistor T4 and the ninth transistor T9. The ninth top gate electrode 29T is located on a side of the fourth top gate electrode 24T in the first direction X, so that the channel region of the fourth transistor T4 and the channel region of the ninth transistor T9 are on a same horizontal line (a straight line extending in the first direction X), and the second region of the fourth active layer and the second region of the ninth active layer connected to each other are located between the fourth top gate electrode 24T and the ninth top gate electrode 29T, which facilitates the connection of the second region of the fourth active layer and the second region of the ninth active layer to the fifth node.

In an exemplary implementation, the fourth transistor T4 and the ninth transistor T9 have a source-drain lateral layout structure, the first region of the fourth active layer and the second region of the fourth active layer (the fifth node) are separated by the fourth top gate electrode 24T, and the fourth top gate electrode 24T can effectively shield influence of a data jump signal on the potential of the fifth node, so that no additional shielding design is needed, which can optimize the spatial layout, and reduce the occupied area of the pixel driving circuit, and therefore is beneficial to realizing high resolution.

Figure 13:
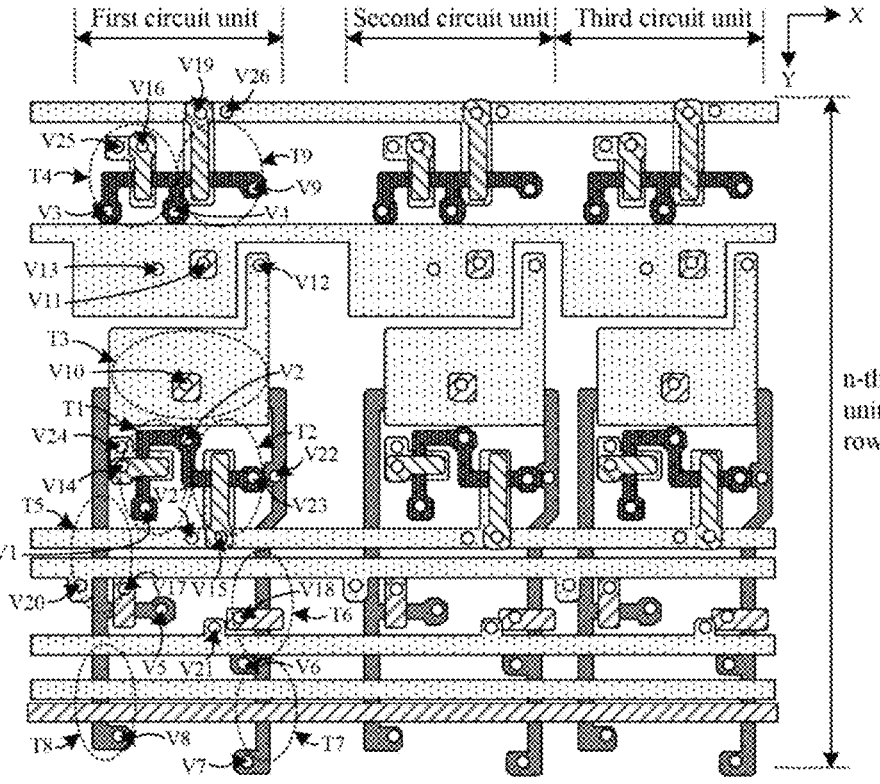
FIG. 13 is a schematic diagram of a display substrate after a pattern of a sixth insulation layer is formed according to the present disclosure.

(6) A pattern of a sixth insulation layer is formed. In an exemplary implementation, forming the pattern of the sixth insulation layer may include: depositing a sixth insulation thin film on the base substrate on which the aforementioned patterns are formed, and patterning the sixth insulation thin film through a patterning process to form the sixth insulation layer that covers the third conductive layer, each circuit unit being provided with a plurality of vias, as shown in FIG. 13.

In an exemplary implementation, the plurality of vias in each circuit unit in the display substrate at least include: a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, a fifteenth via V15, a sixteenth via V16, a seventeenth via V17, an eighteenth via V18, a nineteenth via V19, a twentieth via V20, a twenty-first via V21, a twenty-second via V22, a twenty-third via V23, a twenty-fourth via V24, a twenty-fifth via V25, a twenty-sixth via V26, and a twenty-seventh via V27.

In an exemplary implementation, an orthographic projection of the first via V1 on the base substrate is within the range of the orthographic projection of the first region of the first active layer on the base substrate, the sixth insulation layer and the fifth insulation layer within the first via V1 are etched away to expose a surface of the first region of the first active layer, and the first via V1 is configured such that the first initial signal line formed subsequently is connected to the first region of the first active layer through the via.

In an exemplary implementation mode, an orthographic projection of the second via V2 on the base substrate is within a range of an orthographic projection of the second region of the first active layer (also the first region of the second active layer) on the base substrate. The sixth insulation layer and the fifth insulation layer within the second via V2 are etched away to expose a surface of the second region of the first active layer (also the first region of the second active layer), and the second via V2 is configured such that a first connection electrode formed subsequently is connected to the second region of the first active layer (also the first region of the second active layer) through the via.

In an exemplary implementation, an orthographic projection of the third via V3 on the base substrate is within a range of an orthographic projection of the first region of the fourth active layer on the base substrate, the sixth insulation layer and the fifth insulation layer within the third via V3 are etched away to expose a surface of the first region of the fourth active layer, and the third via V3 is configured such that a third connection electrode formed subsequently is connected to the first region of the fourth active layer through the via.

In an exemplary implementation, an orthographic projection of the fourth via V4 on the base substrate is within a range of an orthographic projection of the second region of the fourth active layer (also the second region of the ninth active layer) on the base substrate, the sixth insulation layer and the fifth insulation layer within the fourth via V4 are etched away to expose a surface of the second region of the fourth active layer (also the second region of the ninth active layer), and the fourth via V4 is configured such that a second connection electrode formed subsequently is connected to the second region of the fourth active layer (also the second region of the ninth active layer) through the via.

In an exemplary implementation, an orthographic projection of the fifth via V5 on the base substrate is within a range of an orthographic projection of the first region of the fifth active layer on the base substrate, the sixth insulation layer, the fifth insulation layer, the fourth insulation layer, the third insulation layer, and the second insulation layer within the fifth via V5 are etched away to expose a surface of the first region of the fifth active layer, and the fifth via V5 is configured such that a fourth connection electrode formed subsequently is connected to the first region of the fifth active layer through the via.

In an exemplary implementation, an orthographic projection of the sixth via V6 on the base substrate is within a range of an orthographic projection of the second region of the sixth active layer (also the second region of the seventh active layer) on the base substrate, the sixth insulation layer, the fifth insulation layer, the fourth insulation layer, the third insulation layer, and the second insulation layer within the sixth via V6 are etched away to expose a surface of the second region of the sixth active layer (also the second region of the seventh active layer), and the sixth via V6 is configured such that a fifth connection electrode formed subsequently is connected to the second region of the sixth active layer (also the second region of the seventh active layer) through the via.

In an exemplary implementation mode, the orthographic projection of the seventh via V7 on the base substrate is within the range of the orthographic projection of the first zone of the seventh active layer on the base substrate, the sixth insulation layer, the fifth insulation layer, the fourth insulation layer, the third insulation layer and the second insulation layer in the seventh via V7 are etched away to expose the surface of the first zone of the seventh active layer, and the seventh via V7 is configured to connect the second initial signal line formed subsequently to the first zone of the seventh active layer through the via V7.

In an exemplary implementation, an orthographic projection of the eighth via V8 on the base substrate is within a range of an orthographic projection of the first region of the eighth active layer on the base substrate, the sixth insulation layer, the fifth insulation layer, the fourth insulation layer, the third insulation layer and the second insulation layer within the eighth via V8 are etched away to expose a surface of the first region of the eighth active layer, and the eighth via V8 is configured such that a second reference signal line formed subsequently is connected to the first region of the eighth active layer through the via.

In an exemplary implementation, an orthographic projection of the ninth via V9 on the base substrate is within a range of an orthographic projection of the first region of the ninth active layer on the base substrate, the sixth insulation layer within the ninth via V9 is etched away to expose a surface of the first region of the ninth active layer, and the ninth via V9 is configured such that a first reference signal line formed subsequently is connected to the first region of the ninth active layer through the via.

In an exemplary implementation, an orthographic projection of the tenth via V10 on the base substrate is within a range of an orthographic projection of the first opening 77 of the third electrode plate 73 on the base substrate, the sixth insulation layer, the fifth insulation layer, the fourth insulation layer, and the third insulation layer within the tenth via V10 are etched away to expose a surface of the first electrode plate 71, and the tenth via V10 is configured such that a first connection electrode formed subsequently is connected to the first electrode plate 71 through the via.

In an exemplary implementation, an orthographic projection of the eleventh via V11 on the base substrate is within a range of an orthographic projection of the second opening 78 of the fourth electrode plate 74 on the base substrate, the sixth insulation layer, the fifth insulation layer, the fourth insulation layer, and the third insulation layer within the eleventh via V11 are etched away to expose a surface of the second electrode plate 72, and the eleventh via V11 is configured such that a second connection electrode formed subsequently is connected to the second electrode plate 72 through the via.

In an exemplary implementation, an orthographic projection of the twelfth via V12 on the base substrate is within a range of an orthographic projection of the electrode plate connection block 73-1 of the third electrode plate 73 on the base substrate, the sixth insulation layer, the fifth insulation layer, and the fourth insulation layer within the twelfth via V12 are etched away to expose a surface of the electrode plate connection block 73-1, and the twelfth via V12 is configured such that a second connection electrode formed subsequently is connected to the electrode plate connection block 73-1 through the via.

In an exemplary implementation, an orthographic projection of the thirteenth via V13 on the base substrate is within a range of an orthographic projection of the fourth electrode plate 74 on the base substrate, the sixth insulation layer, the fifth insulation layer, and the fourth insulation layer within the thirteenth via V13 are etched away to expose a surface of the fourth electrode plate 74, and the thirteenth via V13 is configured such that a first power supply connection line formed subsequently is connected to the fourth electrode plate 74 through the via.

In an exemplary implementation, an orthographic projection of the fourteenth via V14 on the base substrate is within a range of an orthographic projection of the first top gate electrode 21T on the base substrate, the sixth insulation layer within the fourteenth via V14 is etched away to expose a surface of the first top gate electrode 21T, and the fourteenth via V14 is configured such that a fourth scan signal line formed subsequently is connected to the first top gate electrode 21T through the via.

In an exemplary implementation, an orthographic projection of the fifteenth via V15 on the base substrate is within a range of an orthographic projection of the second top gate electrode 22T on the base substrate, the sixth insulation layer within the fifteenth via V15 is etched away to expose a surface of the second top gate electrode 22T, and the fifteenth via V15 is configured such that a fifth scan signal line formed subsequently is connected to the second top gate electrode 22T through the via.

In an exemplary implementation, an orthographic projection of the sixteenth via V16 on the base substrate is within a range of an orthographic projection of the fourth top gate electrode 24T on the base substrate, the sixth insulation layer within the sixteenth via V16 is etched away to expose a surface of the fourth top gate electrode 24T, and the sixteenth via V16 is configured such that a third scan signal line formed subsequently is connected to the fourth top gate electrode 24T through the via.

In an exemplary implementation, an orthographic projection of the seventeenth via V17 on the base substrate is within a range of an orthographic projection of the fifth gate electrode 25 on the base substrate, the sixth insulation layer, the fifth insulation layer, the fourth insulation layer, and the third insulation layer within the seventeenth via V17 are etched away to expose a surface of the fifth gate electrode 25, and the seventeenth via V17 is configured such that a seventh connection electrode formed subsequently is connected to the fifth gate electrode 25 through the via.

In an exemplary implementation, an orthographic projection of the eighteenth via V18 on the base substrate is within a range of an orthographic projection of the sixth gate electrode 26 on the base substrate, the sixth insulation layer, the fifth insulation layer, the fourth insulation layer, and the third insulation layer within the eighteenth via V18 are etched away to expose a surface of the sixth gate electrode 26, and the eighteenth via V18 is configured such that an eighth connection electrode formed subsequently is connected to the sixth gate electrode 26 through the via.

In an exemplary implementation, an orthographic projection of the nineteenth via V19 on the base substrate is within a range of an orthographic projection of the ninth top gate electrode 29T on the base substrate, the sixth insulation layer within the nineteenth via V19 is etched away to expose a surface of the ninth top gate electrode 29T, and the nineteenth via V19 is configured such that a second scan signal line formed subsequently is connected to the ninth top gate electrode 29T through the via.

In an exemplary implementation, an orthographic projection of the twentieth via V20 on the base substrate is within a range of an orthographic projection of the first light emitting connection block 31-1 of the first light emitting signal line 31 on the base substrate, the sixth insulation layer, the fifth insulation layer, and the fourth insulation layer within the twentieth via V20 are etched away to expose a surface of the first light emitting connection block 31-1, and the twentieth via V20 is configured such that a seventh connection electrode formed subsequently is connected to the first light emitting connection block 31-1 through the via.

In an exemplary implementation, an orthographic projection of the twenty-first via V21 on the base substrate is within a range of an orthographic projection of the second light emitting connection block 32-1 of the second light emitting signal line 32 on the base substrate, the sixth insulation layer, the fifth insulation layer, and the fourth insulation layer within the twenty-first via V21 are etched away to expose a surface of the second light emitting connection block 32-1, and the twenty-first via V21 is configured such that an eighth connection electrode formed subsequently is connected to the second light emitting connection block 32-1 through the via.

In an exemplary implementation, an orthographic projection of the twenty-second via V22 on the base substrate is within a range of an orthographic projection of the second region of the third active layer (also the first region of the sixth active layer) on the base substrate, the sixth insulation layer, the fifth insulation layer, the fourth insulation layer, the third insulation layer, and the second insulation layer within the twenty-second via V22 are etched away to expose a surface of the second region of the third active layer, and the twenty-second via V22 is configured such that a sixth connection electrode formed subsequently is connected to the second region of the third active layer (also the first region of the sixth active layer) through the via.

In an exemplary implementation, an orthographic projection of the twenty-third via V23 on the base substrate is within a range of an orthographic projection of the second region of the second active layer on the base substrate, the sixth insulation layer and the fifth insulation layer within the twenty-third via V23 are etched away to expose a surface of the second region of the second active layer, and the twenty-third via V23 is configured such that a sixth connection electrode formed subsequently is connected to the second region of the second active layer through the via.

In an exemplary implementation, an orthographic projection of the twenty-fourth via V24 on the base substrate is within a range of an orthographic projection of the first bottom gate electrode 21B on the base substrate, the sixth insulation layer, the fifth insulation layer, and the fourth insulation layer within the twenty-fourth via V24 are etched away to expose a surface of the first bottom gate electrode 21B, and the twenty-fourth via V24 is configured such that a fourth scan signal line formed subsequently is connected to the first bottom gate electrode 21B through the via.

In an exemplary implementation, an orthographic projection of the twenty-fifth via V25 on the base substrate is within a range of an orthographic projection of the fourth bottom gate electrode 24B on the base substrate, the sixth insulation layer, the fifth insulation layer, and the fourth insulation layer within the twenty-fifth via V25 are etched away to expose a surface of the fourth bottom gate electrode 24B, and the twenty-fifth via V25 is configured such that a third scan signal line formed subsequently is connected to the fourth bottom gate electrode 24B through the via.

In an exemplary implementation, an orthographic projection of the twenty-sixth via V26 on the base substrate is within a range of an orthographic projection of the second scan connection line 34 on the base substrate, the sixth insulation layer, the fifth insulation layer, and the fourth insulation layer within the twenty-sixth via V26 are etched away to expose a surface of the second scan connection line 34, and the twenty-sixth via V26 is configured such that a second scan signal line formed subsequently is connected to the second scan connection line 34 through the via.

In an exemplary implementation, an orthographic projection of the twenty-seventh via V27 on the base substrate is within a range of an orthographic projection of the fifth scan connection line 35 on the base substrate, the sixth insulation layer, the fifth insulation layer, and the fourth insulation layer within the twenty-seventh via V27 are etched away to expose a surface of the fifth scan connection line 35, and the twenty-seventh via V27 is configured such that a fifth scan signal line formed subsequently is connected to the fifth scan connection line 35 through the via.

Figure 14A:
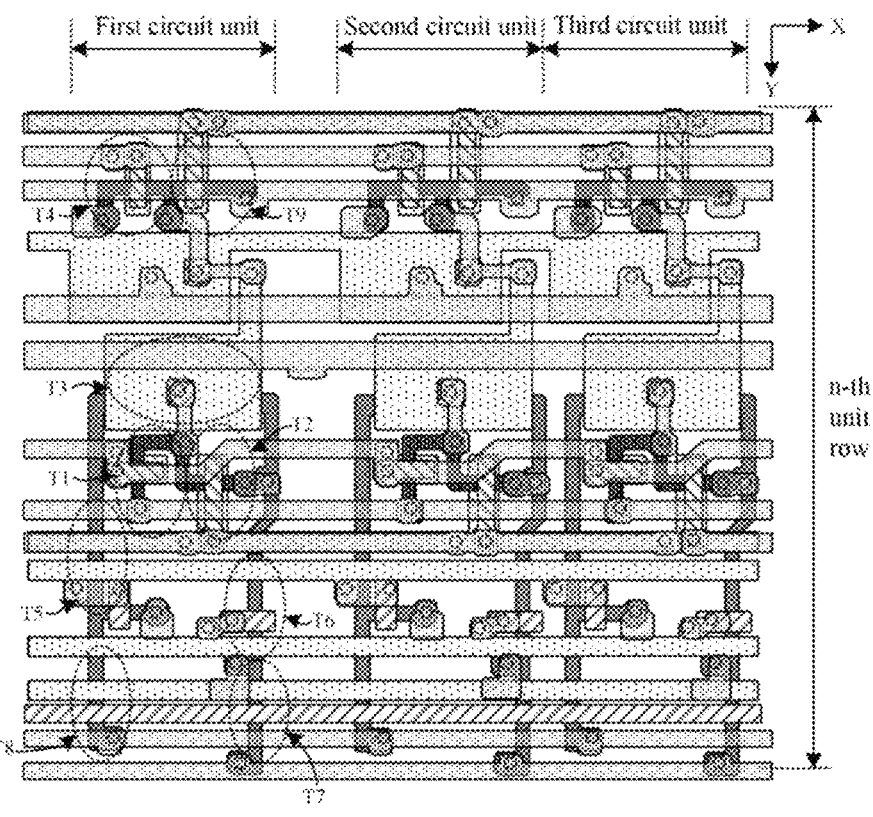
FIG. 14A and FIG. 14B are schematic views of a display substrate after a pattern of a fourth conductive layer is formed according to the present disclosure.
Figure 14B:
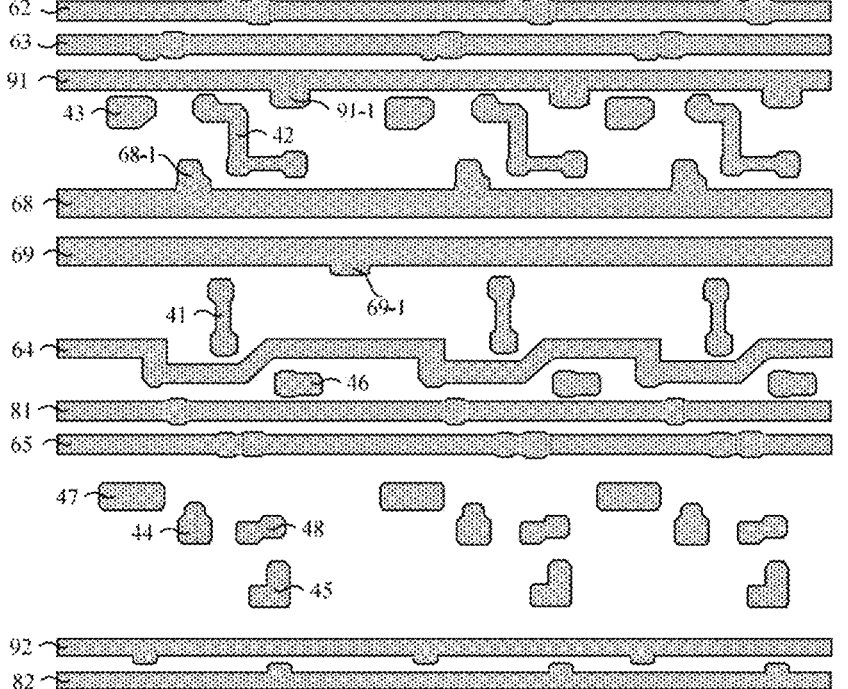

(7) Forming a pattern of a fourth conductive layer. In an exemplary implementation, forming the fourth conductive layer may include: depositing a fourth conductive thin film on the base substrate on which the aforementioned patterns are formed, and patterning the fourth conductive thin film through a patterning process to form the fourth conductive layer disposed on the sixth insulation layer, as shown in FIG. 14A and FIG. 14B, FIG. 14B being a schematic diagram of the fourth conductive layer in FIG. 14A. In an exemplary implementation, the fourth conductive layer may be referred to as a first source drain metal (SD1) layer.

In an exemplary implementation, the pattern of the fourth conductive layer of a plurality of circuit units in the display substrate may include: a first connection electrode 41, a second connection electrode 42, a third connection electrode 43, a fourth connection electrode 44, a fifth connection electrode 45, a sixth connection electrode 46, a seventh connection electrode 47, an eighth connection electrode 48, a second scan signal line 62, a third scan signal line 63, a fourth scan signal line 64, a fifth scan signal line 65, a first power supply connection line 68, a second power supply connection line 69, a first initial signal line 81, a second initial signal line 82, a first reference signal line 91, and a second reference signal line 92.

In an exemplary implementation, the second scan signal line 62, the third scan signal line 63, the fourth scan signal line 64, the fifth scan signal line 65, the first power supply connection line 68, the first initial signal line 81, the second initial signal line 82, the first reference signal line 91, and the second reference signal line 92 may be in a shape of a line with the main body portion extending in the first direction X. The second scan signal line 62, the third scan signal line 63, and the first reference signal line 91 may be located on a side of the fourth electrode plate 74 in an opposite direction of the second direction Y, the fourth scan signal line 64, the fifth scan signal line 65, the first initial signal line 81, the second initial signal line 82, and the second reference signal line 92 may be located on a side of the third electrode plate 73 in the second direction Y, the first power supply connection line 68 may be located in a region where the fourth electrode plate 74 is located, and the second power supply connection line 69 may be located in a region where the third electrode plate 73 is located.

In an exemplary implementation, the first reference signal line 91 may be located on a side of the fourth electrode plate 74 in an opposite direction of the second direction Y, the third scan signal line 63 may be located on a side of the first reference signal line 91 in an opposite direction of the second direction Y, and the second scan signal line 62 may be located on a side of the third scan signal line 63 in an opposite direction of the second direction Y.

In an exemplary implementation, the fourth scan signal line 64 may be in a shape of a polyline with the main body portion extending in the first direction X, and may be located on a side of the third electrode plate 73 in the second direction Y, the first initial signal line 81 may be located on a side of the fourth scan signal line 64 in the second direction Y, the fifth scan signal line 65 may be located on a side of the first initial signal line 81 in the second direction Y, the second reference signal line 92 may be located on a side of the fifth scan signal line 65 in the second direction Y, and the second initial signal line 82 may be located on a side of the second reference signal line 92 in the second direction Y.

In an exemplary implementation, an orthographic projection of the first power supply connection line 68 on the base substrate at least partially overlaps with an orthographic projection of the fourth electrode plate 74 on the base substrate, and the first power supply connection line 68 is configured to be connected to a first power supply line formed subsequently to form a high-voltage power supply grid structure with a net-like communication structure on the display substrate.

In an exemplary implementation, an orthographic projection of the second power supply connection line 69 on the base substrate at least partially overlaps with an orthographic projection of the third electrode plate 73 on the base substrate, and the second power supply connection line 69 is configured to be connected to a second power supply line formed subsequently to form a low-voltage power supply grid structure with a net-like communication structure on the display substrate.

In an exemplary implementation, the second scan signal line 62 is connected to the ninth top gate electrode 29T in each circuit unit through the nineteenth via V19 on the one hand, and to the second scan connection line 34 through the twenty-sixth via V26 on the other hand. Since the second scan connection line 34 is connected to the ninth bottom gate electrode 29B, it is realized that the second scan signal line 62 is connected to the ninth bottom gate electrode 29B and the ninth top gate electrode 29T of the ninth transistor T9, and the second scan signal line 62 can control turn-on and turn-off of the ninth transistor T9.

In an exemplary implementation, the third scan signal line 63 is connected to the fourth top gate electrode 24T in each circuit unit through the sixteenth via V16 on the one hand, and to the fourth bottom gate electrode 24B through the twenty-fifth via V25 on the other hand, thereby realizing that the third scan signal line 63 is connected to the fourth bottom gate electrode 24B and the fourth top gate electrode 24T of the fourth transistor T4, and the third scan signal line 63 can control turn-on and turn-off of the fourth transistor T4.

In an exemplary implementation, the fourth scan signal line 64 is connected to the first top gate electrode 21T in each circuit unit through the fourteenth via V14 on the one hand, and to the first bottom gate electrode 21B through the twenty-fourth via V24 on the other hand, thereby realizing that the fourth scan signal line 64 is connected to the first bottom gate electrode 21B and the first top gate electrode 21T of the first transistor T1, and the fourth scan signal line 64 can control turn-on and turn-off of the first transistor T1.

In an exemplary implementation, the fifth scan signal line 65 is connected to the second top gate electrode 22T in each circuit unit through the fifteenth via V15 on the one hand, and to the fifth scan connection line 35 through the twenty-seventh via V27 on the other hand. Since the fifth scan connection line 35 is connected to the second bottom gate electrode 22B, it is realized that the fifth scan signal line 65 is connected to the second bottom gate electrode 22B and the second top gate electrode 22T of the second transistor T2, and the fifth scan signal line 65 can control turn-on and turn-off of the second transistor T2.

In an exemplary implementation mode, the second scan signal line 62 and the fifth scan signal line 65 may extend to a bezel region and be connected to a same gate drive circuit to achieve output of a same scan signal.

In an exemplary implementation, since the second scan connection line 34 of the second conductive layer is connected to the fifth scan signal line 65 of the fourth conductive layer, the second scan connection line 34 and the fifth scan signal line 65 form a signal line with a double-layer structure, which can reduce the resistance of the signal line, can reduce the voltage drop of the scan signal, and is beneficial to improving the uniformity of the panel, thereby avoiding poor display of the display substrate, and ensuring the display effect of the display substrate.

In an exemplary implementation, since the fifth scan connection line 35 of the second conductive layer is connected to the fifth scan signal line 65 of the fourth conductive layer, the fifth scan connection line 35 and the fifth scan signal line 65 form a signal line with a double-layer structure, which can reduce the resistance of the signal line, can reduce the voltage drop of the scan signal, and is beneficial to improving the uniformity of the panel, thereby avoiding poor display of the display substrate, and ensuring the display effect of the display substrate.

In an exemplary implementation, the first power supply connection line 68 is connected to a fourth electrode plate 74 in each circuit unit through the thirteenth via V13, thereby the first power supply connection line 68 being connected to the fourth electrode plate 74 is achieved. Since the first power supply connection line 68 is connected to the first power supply line formed subsequently, the first power supply connection line 68 can write a first power supply signal to the fourth electrode plate 74 of the second storage capacitor.

In an exemplary implementation, a first power supply connection block 68-1 is provided on a side of the first power supply connection line 68 close to the first reference signal line 91, a first end of the first power supply connection block 68-1 is connected to the first power supply connection line 68, and a second end of the first power supply connection block 68-1 extends in a direction towards the first reference signal line 91. In an exemplary implementation, the first power supply connection block 68-1 is configured such that on one hand, the first power supply connection block 68-1 is connected to the fourth electrode plate 74 through the thirteenth via V13; on the other hand, the first power supply connection block 68-1 is connected to a first power supply line to be formed subsequently.

In an exemplary implementation, a second power supply connection block 69-1 is provided on a side of the second power supply connection line 69 close to the fourth scan signal line 64, a first end of the second power supply connection block 69-1 is connected to the second power supply connection line 69, and a second end of the second power supply connection block 69-1 extends in a direction towards the fourth scan signal line 64. In an exemplary implementation, the second power supply connection block 69-1 is configured to be connected to a second power supply line formed subsequently.

In an exemplary implementation, the first initial signal line 81 is connected to a first region of a first active layer in each circuit unit through the first via V1, thereby the first initial signal line 81 being connected to the first electrode of the seventh transistor T1 is achieved, and the first initial signal line 81 can write the first initial signal to the first electrode of the first transistor T1.

In an exemplary implementation, the second initial signal line 82 is connected to a first region of a seventh active layer in each circuit unit through the seventh via V7, thereby the second initial signal line 82 being connected to the first electrode of the seventh transistor T7 is achieved, and the second initial signal line 82 can write the second initial signal to the first electrode of the seventh transistor T7.

In an exemplary implementation, the first reference signal line 91 is connected to a first region of a ninth active layer in each circuit unit through the ninth via V9, thereby the first reference signal line 91 being connected to the first electrode of the ninth transistor T9 is achieved, and the first reference signal line 91 can write the first reference signal to the first electrode of the ninth transistor T9.

In an exemplary implementation, a reference connection block 91-1 is provided on a side of the first reference signal line 91 close to the first power supply connection line 68, a first end of the reference connection block 91-1 is connected to the first reference signal line 91, a second end of the reference connection block 91-1 extends in a direction towards the first power supply connection line 68, and the reference connection block 91-1 is configured to be connected to the first region of the ninth active layer through the ninth via V9 on the one hand, and to be connected to the reference connection line formed subsequently on the other hand, to form a reference signal grid structure with a net-like communication structure on the display substrate.

In an exemplary implementation, the second reference signal line 92 is connected to the first region of the eighth active layer in each circuit unit through the eighth via V8, thereby realizing that the second reference signal line 92 is connected to the first electrode of the eighth transistor T8, and the second reference signal line 92 can write a second reference signal to the first electrode of the eighth transistor T8.

In an exemplary implementation, the first connection electrode 41 may be in a shape of a strip with the main body portion extending in the second direction Y, a first end of the first connection electrode 41 is connected to the first electrode plate 71 through the tenth via V10, and a second end of the first connection electrode 41 is connected to the second region of the first active layer (also the first region of the second active layer) through the second via V2. The first connection electrode 41 is connected to the first electrode plate 71, and the first electrode plate 71 serves as the gate electrode of the third transistor T3. Thus, the first connection electrode 41 enables the second electrode of the first transistor T1, the first electrode of the second transistor T2, the gate electrode of the third transistor T3, and the first electrode plate 71 of the first storage capacitor to have a same potential, and the first connection electrode 41 can serve as the first node N1 in the pixel driving circuit.

In an exemplary implementation, the second connection electrode 42 may be in a shape of a polyline with the main body portion extending in the second direction Y, a first end of the second connection electrode 42 is connected to the second region of the fourth active layer (also the second region of the ninth active layer) through the fourth via V4, a second end of the second connection electrode 42 is connected to the electrode plate connection block 73-1 of the third electrode plate 73 through the twelfth via V12, and a middle portion between the first end and the second end is connected to the second electrode plate 72 through the eleventh via V11. Since the electrode plate connection block 73-1 is connected to the third electrode plate 73, the second connection electrode 42 enables the second electrode of the fourth transistor T4, the second electrode of the ninth transistor T9, the third electrode plate 73 of the first storage capacitor, and the second electrode plate 72 of the second storage capacitor to have a same potential, and the second connection electrode 42 may serve as the fifth node N5 in the pixel driving circuit.

In an exemplary implementation, the third connection electrode 43 may be in a shape of a block (e.g., in a shape of a rectangle, etc.), and the third connection electrode 43 is connected to the first region of the fourth active layer through the third via V3. In an exemplary implementation, the third connection electrode 43 may serve as a first electrode of the fourth transistor T4, and is configured to connect with a data signal line formed later.

In an exemplary implementation, the fourth connection electrode 44 may be in a shape of a block (e.g., in a shape of a rectangle, etc.), and the fourth connection electrode 44 is connected to the first region of the fifth active layer through the fifth via V5. In an exemplary implementation, the fourth connection electrode 44 may serve as a first electrode of the fifth transistor T5, and is configured to connect with the first power supply line formed later.

In an exemplary implementation, the fifth connection electrode 45 may be in a shape of "L", and the fifth connection electrode 45 is connected to the second region of the sixth active layer (also the second region of the seventh active layer) through the sixth via V6. In an exemplary implementation, the fifth connection electrode 45 may serve as a second electrode of the sixth transistor T6 and a second electrode of the seventh transistor T7, and the fifth connection electrode 45 is configured to connect with an anode connection electrode formed later.

In an exemplary implementation, the sixth connection electrode 46 may be in a shape of a strip with the main body portion extending in the first direction X, a first end of the sixth connection electrode 46 is connected to the second region of the third active layer (also the first region of the sixth active layer) through the twenty-second via V22, and a second end of the sixth connection electrode 46 is connected to the second region of the second active layer through the twenty-third via V23. In an exemplary implementation, the sixth connection electrode 46 enables the second electrode of the second transistor T2, the second electrode of the third transistor T2, and the first electrode of the sixth transistor T6 to be connected to each other and have a same potential, and the sixth connection electrode 46 may serve as the third node N3 in the pixel driving circuit.

In an exemplary implementation, the seventh connection electrode 47 may be in a shape of a strip with the main body portion extending in the first direction X, a first end of the seventh connection electrode 47 is connected to the fifth gate electrode 25 through the seventeenth via V17, and a second end of the seventh connection electrode 47 is connected to the first light emitting connection block 31-1 through the twentieth via V20. Since the first light emitting connection block 31-1 is connected to the first light emitting signal line 31, it is realized that the first light emitting signal line 31 is connected to the gate electrode of the fifth transistor T5, and the first light emitting signal line 31 may control turn-on and turn-off of the fifth transistor T5.

In an exemplary implementation, the eighth connection electrode 48 may be in a shape of a strip with the main body portion extending in the first direction X, a first end of the eighth connection electrode 48 is connected to the sixth gate electrode 26 through the eighteenth via V18, and a second end of the eighth connection electrode 48 is connected to the second light emitting connection block 32-1 through the twenty-first via V21. Since the second light emitting connection block 32-1 is connected to the second light emitting signal line 32, it is realized that the second light emitting signal line 32 is connected to the gate electrode of the sixth transistor T6, and the second light emitting signal line 32 may control turn-on and turn-off of the sixth transistor T6.

In an exemplary implementation, because the first electrode plate 71 is connected to the second region of the second active layer (also the first region of the second active layer) through the first connection electrode 41, the first electrode plate 71 has a potential of the first node N1. Since the third electrode plate 73 is connected to the second electrode plate 72 and the second region of the fourth active layer (also the second region of the ninth active layer) through the second connection electrode 42, the second electrode plate 72 and the third electrode plate 73 have the potential of the fifth node N5. Since the fourth electrode plate 74 is connected to the first power supply connection line 68, and the first power supply connection line 68 is connected to a first power supply line formed subsequently, the fourth electrode plate 74 has a potential of the first power supply line. In this way, the first electrode plate 71 having the potential of the first node N1 and the third electrode plate 73 having the potential of the fifth node N5 form the first storage capacitor of the pixel driving circuit, and the second electrode plate 72 having the potential of the fifth node N5 and the fourth electrode plate 74 having the potential of the first power supply line form the second storage capacitor of the pixel driving circuit.

In an exemplary implementation, there is a first overlapping region between the orthographic projection of the first electrode plate 71 on the base substrate and the orthographic projection of the third electrode plate 73 on the base substrate, and a capacitance value of the first storage capacitor is proportional to an area of the first overlapping region. Thus, the capacitance value of the first storage capacitor may be adjusted by adjusting the area of the first overlapping region. There is a second overlapping region between the orthographic projection of the second electrode plate 72 on the base substrate and the orthographic projection of the fourth electrode plate 74 on the base substrate, and a capacitance value of the second storage capacitor is proportional to an area of the second overlapping region. Thus, the capacitance value of the second storage capacitor may be adjusted by adjusting the area of the second overlapping region.

Figure 15:
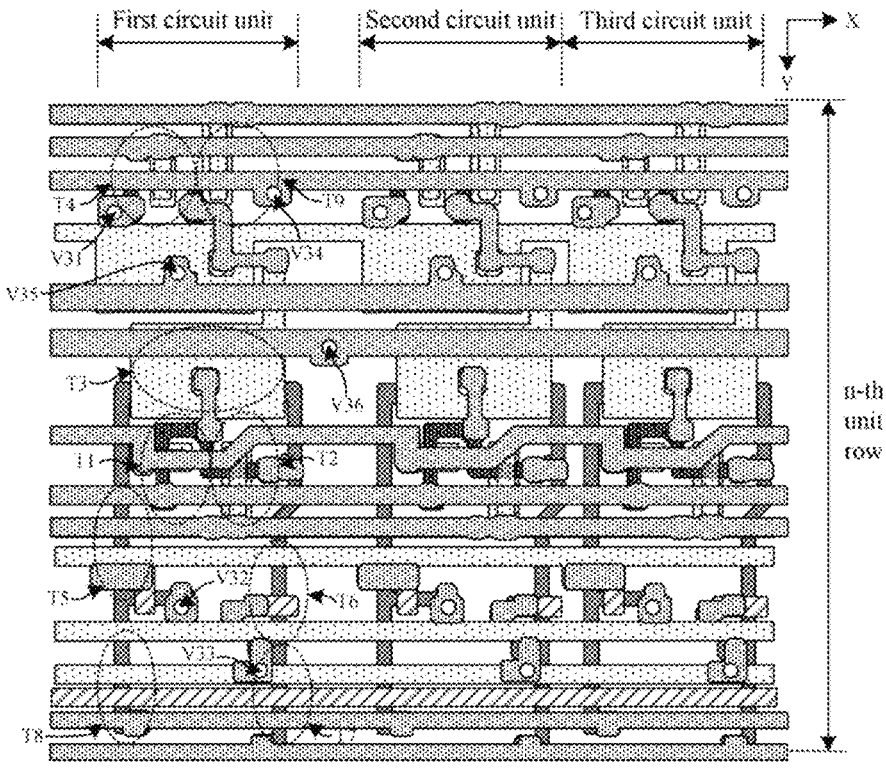
FIG. 15 is a schematic diagram of a display substrate after a pattern of a seventh insulation layer is formed according to the present disclosure.

(8) A pattern of a seventh insulation layer is formed. In an exemplary implementation, forming the pattern of the seventh insulation layer may include: depositing a seventh insulation thin film on the base substrate on which the aforementioned patterns are formed, and patterning the seventh insulation thin film through a patterning process, to form the seventh insulation layer that covers the fourth conductive layer, each circuit unit being provided with a plurality of vias, as shown in FIG. 15.

In an exemplary implementation, a plurality of vias of each circuit unit in the display substrate includes, at least, a thirty-first via V31, a thirty-second via V32, a thirty-third via V33, a thirty-fourth via V34, and a thirty-fifth via V35.

In an exemplary implementation, an orthographic projection of the thirty-first via V31 on the base substrate is within a range of an orthographic projection of the third connection electrode 43 on the base substrate, the seventh insulation layer within the thirty-first via V31 is removed to expose a surface of the third connection electrode 43, and the thirty-first via V31 is configured such that a data signal line formed subsequently is connected to the third connection electrode 43 through the via.

In an exemplary implementation, an orthographic projection of the thirty-second via V32 on the base substrate is within a range of an orthographic projection of the fourth connection electrode 44 on the base substrate, the seventh insulation layer within the thirty-second via V32 is removed to expose a surface of the fourth connection electrode 44, and the thirty-second via V32 is configured such that a first power supply line formed subsequently is connected to the fourth connection electrode 44 through the via.

In an exemplary implementation, an orthographic projection of the thirty-third via V33 on the base substrate is within a range of an orthographic projection of the fifth connection electrode 45 on the base substrate, the seventh insulation layer within the thirty-third via V33 is removed to expose a surface of the fifth connection electrode 45, and the thirty-third via V33 is configured such that an anode connection electrode formed subsequently is connected to the fifth connection electrode 45 through the via.

In an exemplary implementation, an orthographic projection of the thirty-fourth via V34 on the base substrate is within a range of an orthographic projection of the reference connection block 91-1 of the first reference signal line 91 on the base substrate, the seventh insulation layer within the thirty-fourth via V34 is removed to expose a surface of the reference connection block 91-1, and the thirty-fourth via V34 is configured such that a reference connection line formed subsequently is connected to the reference connection block 91-1 through the via.

In an exemplary implementation, an orthographic projection of the thirty-fifth via V35 on the base substrate is within a range of an orthographic projection of the first power supply connection block 68-1 of the first power supply connection line 68 on the base substrate, the seventh insulation layer within the thirty-fifth via V35 is removed to expose a surface of the first power supply connection block 68-1, and the thirty-fifth via V35 is configured such that a first power supply line formed subsequently is connected to the first power supply connection block 68-1 through the via.

In an exemplary implementation, the at least one circuit unit may further include a thirty-sixth via V36. An orthographic projection of the thirty-sixth via V36 on the base substrate is within a range of an orthographic projection of the second power supply connection block 69-1 of the second power supply connection line 69 on the base substrate, the seventh insulation layer within the thirty-sixth via V36 is removed to expose a surface of the second power supply connection block 69-1, and the thirty-sixth via V36 is configured such that a second power supply line formed subsequently is connected to the second power supply connection block 69-1 through the via. In an exemplary implementation, the thirty-sixth via V36 may be located between the first circuit unit and the second circuit unit.

Figure 16A:
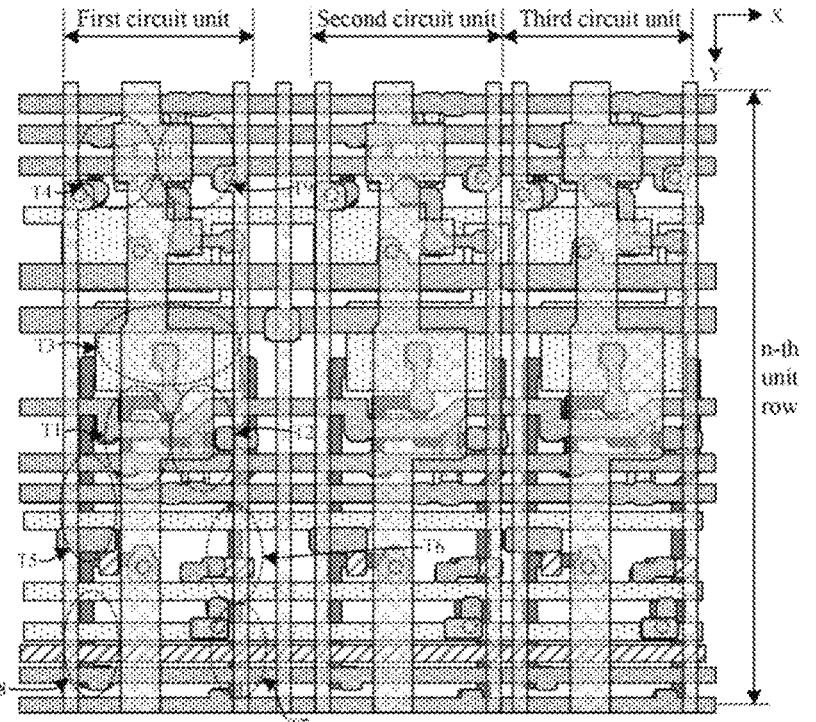
FIG. 16A and FIG. 16B are schematic diagrams of a display substrate after a pattern of a fifth conductive layer is formed according to the present disclosure.
Figure 16B:
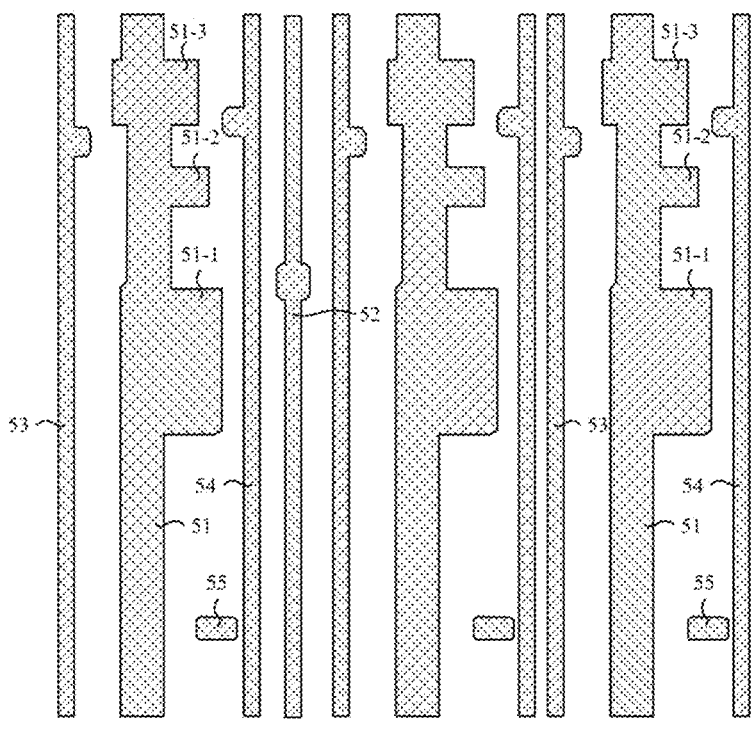

(9) Forming a pattern of a fifth conductive layer. In an exemplary implementation, forming the pattern of the fifth conductive layer may include: depositing a fifth conductive thin film on the base substrate on which the aforementioned patterns are formed, and patterning the fifth conductive thin film through a patterning process to form the fifth conductive layer disposed on the seventh insulation layer, as shown in FIG. 16A and FIG. 16B, FIG. 16B being a schematic diagram of the fifth conductive layer in FIG. 16A. In an exemplary implementation, the fifth conductive layer may be referred to as a second source-drain metal (SD2) layer.

In an exemplary implementation, the pattern of the fourth conductive layer of a plurality of circuit units in the display substrate may include: a first power supply line 51, a data signal line 53, a reference connection line 54, and an anode connection electrode 55.

In an exemplary implementation, the first power supply line 51, the data signal line 53, and the reference connection line 54 may be in a shape of a strip with the main body portion extending in the second direction Y, the first power supply line 51 may be located on a side of the data signal line 53 in the first direction X, and the reference connection line 54 may be located on a side of the first power supply line 51 in the first direction X, that is, the first power supply line 51 may be located between the data signal line 53 and the reference connection line 54.

In an exemplary implementation, the first power supply line 51 may be in a shape of a straight line with the main body portion extending in the second direction Y. The first power supply line 51 is connected to the fourth connection electrode 44 through the thirty-second via V32 on the one hand, and to the first power supply connection electrode 68-1 through the thirty-fifth via V35 on the other hand. Since the fourth connection electrode 44 is connected to the first region of the fifth active layer through a via, it is achieved that the first power supply line 51 writes a first power supply signal into the first electrode of the fifth transistor T5. Since the first power supply connection block 68-1 is connected to the first power supply connection line 68, the first power supply connection line 68 in which a main body portion extends in the first direction X and the first power supply line 51 in which a main body portion extends in the second direction Y are connected to each other, so that the first power supply line 51 and the first power supply connection line 68 form a mesh structure for transmitting the first power supply signal in the display substrate, which can not only effectively reduce a resistance of the first power supply line 51 and reduce the voltage drop of the first power supply signal, but also effectively improve uniformity of the first power supply signal in the display substrate, effectively improve display uniformity and improve the display quality.

In an exemplary implementation, a first shielding block 51-1 may be provided on a side of the first power supply line 51 close to the reference connection line 54, a first end of the first shielding block 51-1 is connected to the first power supply line 51, and a second end of the first shielding block 51-1 extends in a direction towards the reference connection line 54. The first shielding block 51-1 may be in a shape of a block (e.g., in a shape of a rectangle, etc.), and an orthographic projection of the first shielding block 51-1 on the base substrate at least partially overlaps with an orthographic projection of the first connection electrode 41 on the base substrate. Since the first connection electrode 41 serves as the first node N1 in the pixel driving circuit, the first shielding block 51-1 which is at a constant voltage can effectively shield an influence of other signals in the pixel driving circuit on the first node N1, thereby avoiding an influence of other signals (such as a data voltage jump) on a potential at the first node N1 in the pixel driving circuit, and improving the display effect.

In an exemplary implementation, the orthographic projection of the first shielding block 51-1 on the base substrate may include the orthographic projection of the first connection electrode 41 on the base substrate.

In an exemplary implementation, a second shielding block 51-2 may further be provided on a side of the first power supply line 51 close to the reference connection line 54, a first end of the second shielding block 51-2 is connected to the first power supply line 51, and a second end of the second shielding block 51-2 extends in a direction towards the reference connection line 54. The second shielding block 51-2 may be in a shape of a block (e.g., in a shape of a rectangle, etc.), and an orthographic projection of the second shielding block 51-2 on the base substrate at least partially overlaps with an orthographic projection of the second connection electrode 42 on the base substrate. Since the second connection electrode 42 serves as the fifth node N5 in the pixel driving circuit, the second shielding block 51-2 which is at a constant voltage can effectively shield an influence of other signals in the pixel driving circuit on the fifth node N5, thereby avoiding an influence of other signals (such as a data voltage jump) on a potential at the fifth node N5 in the pixel driving circuit, and improving the display effect.

In an exemplary implementation, the first power supply line 51 may be further provided with a third shielding block 51-3. The third shielding block 51-3 may be in a shape of a block (e.g., in a shape of a rectangle, etc.), an orthographic projection of the third shielding block 51-3 on the base substrate at least partially overlaps with orthographic projections of the fourth top gate electrode 24T and the ninth top gate electrode 29T on the base substrate, and the third shielding block 51-3 is configured to shield key nodes of the fourth transistor T4 and the ninth transistor T9, thereby preventing other signals from affecting the electrical properties of the fourth oxide transistor T4 and the ninth oxide transistor T9, and improving the display effect.

In the present disclosure, by arranging the first shielding block 51-1, the second shielding block 51-2, and the third shielding block 51-3, it is realized that the first power supply line 51 simultaneously shields the first node N1, the fifth node N5, and the oxide transistors, improving the electrical properties of the pixel driving circuit and improving the display effect.

In an exemplary implementation, the first power supply line 51, the first shielding block 51-1, the second shielding block 51-2, and the third shielding block 51-3 may be connected to each other to form an integrated structure.

In an exemplary implementation, the first power supply line 51 may be of an unequal width design, and the first power supply line 51 with the unequal width design can not only facilitate a layout of a pixel structure, but also reduce a parasitic capacitance between the first power supply line and the data signal line.

In an exemplary implementation, a shape of the data signal line 53 may be a shape of straight line in which a main body portion extends in the second direction Y, and the data signal line 53 is connected to the third connection electrode 43 through the thirty-first via V31. Because the third connection electrode 43 is connected to the first region of the fourth active layer through a via, the data signal of the data signal line 53 is written to the first electrode of the fourth transistor T4 is achieved.

In an exemplary implementation, the reference connection line 54 may be in a shape of a straight line with the main body portion extending in the second direction Y, and the reference connection line 54 is connected to the reference connection block 91-1 through the thirty-fourth via V34. Since the reference connection block 91-1 is connected to the first reference signal line 91, it is realized that the first reference signal line 91 with the main body portion extending in the first direction X and the reference connection line 54 with the main body portion extending in the second direction Y are connected to each other, so that the first reference signal line 91 and the reference connection line 54 form a mesh structure for transmitting a first reference signal on the display substrate, which not only can effectively reduce the resistance of the first reference signal line and reduce a voltage drop of the first reference signal, but also can effectively improve uniformity of the first reference signal in the display substrate, thereby effectively improving the display uniformity and improving the display quality.

In an exemplary implementation mode, the anode connection electrode 55 may be in a shape of a block (e.g., a rectangle), and the anode connection electrode 55 is connected to the fifth connection electrode 45 through the thirty-third via V33. Because the fifth connection electrode 45 is connected to the second region of the sixth active layer (also the second region of the seventh active layer) through a via, it is achieved that the anode connection electrode 55 is connected to the second electrode of the sixth transistor T6 and the second electrode of the seventh transistor T7. In an exemplary implementation, the anode connection electrode 55 is configured to connect with the anode formed later, thereby the pixel driving circuit can drive a light emitting device.

In an exemplary implementation, the at least one circuit unit may further include a second power supply line 52. A shape of the second power supply line 52 may be a shape of straight line in which a main body portion extends in the second direction Y, and the second power supply line 52 is connected to the second power supply connection block 69-1 through the thirty-sixth via V36. Since the second power supply connection block 69-1 is connected to the second power supply connection line 69, it is realized that the second power supply connection line 69 with the main body portion extending in the first direction X and the second power supply line 52 with the main body portion extending in the second direction Y are connected to each other, so that the second power supply connection line 69 and the second power supply line 52 form a mesh structure for transmitting a second power supply signal on the display substrate, which not only can effectively reduce the resistance of the second power supply line 52 and reduce a voltage drop of the second power supply signal, but also can effectively improve uniformity of the second power supply signal in the display substrate, thereby effectively improving display uniformity and improving the display quality. In an exemplary implementation, the second power supply line 52 may be located between the reference connection line 54 of the first circuit unit and the data signal line 53 of the second circuit unit.

In an exemplary implementation, the first power supply connection line 68 of the fourth conductive layer may be disposed in each unit row, the first power supply line 51 of the fifth conductive layer may be disposed in each unit column, and a plurality of first power supply lines 51 are connected to a plurality of first power supply connection lines 68, respectively, to form a net-like structure for transmitting the first power supply signal.

In an exemplary implementation, the first reference signal line 91 of the fourth conductive layer may be disposed in each unit row, the reference connection line 54 of the fifth conductive layer may be disposed in each unit column, and a plurality of first reference signal lines 91 are connected to a plurality of reference connection lines 54, respectively, to form a mesh structure for transmitting the first reference signal.

In an exemplary implementation, the second power supply connection line 69 of the fourth conductive layer may be disposed in each unit row, the second power supply line 52 of the fifth conductive layer may be disposed every two unit columns, and a plurality of second power supply lines 52 are connected to a plurality of second power supply connection lines 69, respectively, to form a mesh structure for transmitting the second power supply signal.

A subsequent manufacturing process may include forming a pattern of a first planarization layer, the first planarization layer is provided with a plurality of anode vias, orthographic projections of the anode vias on the base substrate are within a range of an orthographic projection of the anode connection electrode on the base substrate. A first planarization layer within the anode vias is removed to expose a surface of the anode connection electrode, and the anode vias are configured such that the anode formed later is connected to the anode connection electrode through the anode vias.

So far, a drive circuit layer has been prepared on the base substrate. In an exemplary implementation, after the drive circuit layer is manufactured, a light emitting structure layer and an encapsulation structure layer may be sequentially manufactured on the drive circuit layer, which is not repeated here.

In an exemplary implementation, in a plane parallel to the display substrate, the drive circuit layer may include a plurality of circuit units, each of the circuit units may include a pixel driving circuit, and a first scan signal line, a second scan signal line, a third scan signal line, a fourth scan signal line, a fifth scan signal line, a first light emitting signal line, a second light emitting signal line, a first initial signal line, a second initial signal line, a first reference signal line, a second reference signal line, a first power supply line and a data signal line, which are connected to the pixel driving circuit. In a plane perpendicular to the display substrate, the drive circuit layer may at least include a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, and a fifth conductive layer, which are stacked sequentially on the base substrate.

In an exemplary embodiment of the present disclosure, the third active layer 13, and the fifth active layer 15 to the eighth active layer 18 may be disposed in the first semiconductor layer; the fifth gate electrode 25, the sixth gate electrode 26, the first scan signal line 61, the first electrode plate 71, and the second electrode plate 72 may be disposed in the first conductive layer; the first bottom gate electrode 21B, the second bottom gate electrode 22B, the fourth bottom gate electrode 24B, the ninth bottom gate electrode 29B, the first light emitting signal line 31, the second light emitting signal line 32, the repair line 33, the second scan connection line 34, the fifth scan connection line 35, the third electrode plate 73, and the fourth electrode plate 74 may be disposed in the second conductive layer; the first active layer 11, the second active layer 12, the fourth active layer 14, and the ninth active layer 19 may be disposed in the second semiconductor layer; the first top gate electrode 21T, the second top gate electrode 22T, the fourth top gate electrode 24T, and the ninth top gate electrode 29T may be disposed in the third conductive layer; the first connection electrode 41 to the eighth connection electrode 48, the second scan signal line 62 to the fifth scan signal line 65, the first power supply connection line 68, the second power supply connection line 69, the first initial signal line 81, the second initial signal line 82, the first reference signal line 91, and the second reference signal line 92 may be disposed in the fourth conductive layer; and the first power supply line 51, the second power supply line 52, the data signal line 53, the reference connection line 54, and the anode connection electrode 55 may be disposed in the fifth conductive layer.

In an exemplary implementation mode, the base substrate may be a flexible base substrate, or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. In an exemplary implementation, the flexible base substrate may include a first flexible material layer, a first inorganic material layer, a first semiconductor layer, a second flexible material layer, and a second inorganic material layer which are stacked. Materials of the first flexible material layer and the second flexible material layer may be Polyimide (PI), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the first semiconductor layer may be amorphous silicon (a-si).

In an exemplary implementation mode, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the aforementioned metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer, the fifth insulation layer, the sixth insulation layer, and the seventh insulation layer may be made of any one or more of silicon oxide (SiOx), silicon nitride (SiNx), and silicon oxynitride (SiON), and may be single layers, multiple layers, or composite layers.

A large-size display substrate with high resolution has problems such as poor display, which reduces the display quality. The inventors of the present application have found, upon study, that problems such as poor display are due in part to unstable voltage of the gate electrode of the driving transistor. Due to the leakage of the first node and the fifth node, the potential of the first node and the fifth node is unstable, resulting in a leakage of the gate electrode of the driving transistor, which affects the voltage of the gate electrode of the driving transistor, thereby causing related display defects.

In an embodiment of the present disclosure, the first transistor and the second transistor connected to the first node, and the fourth transistor and the ninth transistor connected to the fifth node are oxide transistors, and the other transistors are low-temperature polycrystalline silicon transistors, which effectively reduces the leakage of the first node and the fifth node, stabilizes the potential of the first node and the fifth node, can improve leakage of the gate electrode of the driving transistor and related display defects caused by the leakage, thereby improving the stability of the voltage of the gate electrode of the driving transistor, effectively improving the display uniformity, and improving the display quality.

In a display substrate, in order to solve the problem of leakage of a first node and a fifth node, a first transistor, a second transistor, a fourth transistor, and a ninth transistor having a double gate structure are used. In an embodiment of the present disclosure, by using oxide transistors, transistors having a double gate structure are not needed, and shielding structures for transistors having a double gate structure are also not needed, which simplifies the structure of the pixel driving circuit to the greatest extent, reduces the occupied area of the pixel driving circuit, and is beneficial to improving the resolution of the display substrate.

In an embodiment of the present disclosure, a first power supply line and a power supply shielding block are arranged to shield the first node, the fifth node and the oxide transistors, which can effectively prevent other signals from affecting the first node, the fifth node and the oxide transistors of the pixel driving circuit, and can further improve leakage of the gate electrode of the driving transistor and related display defects caused by the leakage, thereby improving the stability of the voltage of the gate electrode of the driving transistor.

In the embodiment of the present disclosure, by providing the first power supply connection line in which the main body portion extends in the first direction X and the first power supply line in which the main body portion extends in the second direction Y, and the first power supply connection line and the first power supply connection line are connected to each other, so that the first power supply line and the first power supply connection line form the mesh structure for transmitting the first power supply signal in the display substrate, which can not only effectively reduce the resistance of the first power supply line and reduce the voltage drop of the first power supply signal, but also effectively improve the uniformity of the first power supply signal in the display substrate, effectively improve the display uniformity and improve the display quality.

In an embodiment of the present disclosure, a second power supply connection line with the main body portion extending in the first direction X and a second power supply line with the main body portion extending in the second direction Y are arranged, and the second power supply line and the second power supply connection line are connected to each other, so that the second power supply line and the second power supply connection line form a mesh structure for transmitting a second power supply signal on the display substrate, which may not only effectively reduce a resistance of the second power supply line and reduce a voltage drop of the second power supply signal, but also effectively improve uniformity of the second power supply signal in the display substrate, thereby effectively improving display uniformity and improving display quality.

In an embodiment of the present disclosure, a first reference signal line with the main body portion extending in the first direction X and a reference connection line with the main body portion extending in the second direction Y are arranged, and the first reference signal line and the reference connection line are connected to each other, so that the first reference signal line and the reference connection line form a mesh structure for transmitting a first reference signal on the display substrate, which may not only effectively reduce a resistance of the first reference signal line and reduce a voltage drop of the first reference signal, but also effectively improve uniformity of the first reference signal in the display substrate, thereby effectively improving display uniformity and improving display quality.

In the embodiment of the present disclosure, by providing the second scan signal line and the fifth scan signal line in the double-layer structure, resistance of the signal line can be effectively reduced, which effectively reduces voltage drop of a scanning signal, improves uniformity of the panel, avoids poor display of the display substrate, and ensures the display effect of the display substrate.

The preparation process in the present disclosure may be compatible well with an existing preparation process, is simple in process implementation, is easy to implement, and has a high production efficiency, a low production cost, and a high yield.

The structure shown and mentioned above in the present disclosure and the manufacturing process therefor are merely an exemplary description. In an exemplary implementation, the corresponding structures may be altered and the patterning processes may be added or reduced according to actual needs. For example, the reference connection line in the fifth conductive layer may be connected to the second reference signal line, so that the second reference signal line and the reference connection line form a mesh structure for transmitting a second reference signal on the display substrate. In another example, the second power supply line in the fifth conductive layer may be used as a vertical connection line, and the vertical connection line is connected to the first initial signal line, so that the first initial signal line and the vertical connection line form a mesh structure for transmitting a first initial signal on the display substrate, or the vertical connection line is connected to the second initial signal line, so that the second initial signal line and the vertical connection line form a mesh structure for transmitting a second initial signal on the display substrate. In a further example, the first reference signal line or the second reference signal line may be connected to one electrode plate in the second storage capacitor, which is not limited here in the present disclosure.

In an exemplary implementation mode, the display substrate according to the present disclosure may be applied to a display device with a pixel driving circuit, such as an OLED, quantum dot display (QLED), light emitting diode display (Micro LED or Mini LED), or Quantum Dot Light Emitting Diode display (QDLED), which is not limited here in the present disclosure.

The present disclosure also provides a method for manufacturing a display substrate, for manufacturing the display substrate according to the foregoing embodiments. In an exemplary implementation, the display substrate includes a plurality of circuit units forming a plurality of unit rows and a plurality of unit columns; and the manufacturing method for the display substrate may include:

forming a pixel driving circuit in at least one circuit unit, wherein the pixel driving circuit at least includes a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor; a first electrode of the first transistor is connected to a first initial signal line, a second electrode of the first transistor is connected to a first electrode of the second transistor, a gate electrode of the third transistor, and a first end of the first storage capacitor; a first electrode of the fourth transistor is connected to a data signal line, a second electrode of the fourth transistor is connected to a second electrode of the ninth transistor, a second end of the first storage capacitor, and a second end of the second storage capacitor; a first electrode of the ninth transistor is connected to a first reference signal line; and a first end of the second storage capacitor is connected to a first power supply line; the first transistor, the second transistor, the fourth transistor, and the ninth transistor are oxide transistors, and the third transistor is a low-temperature polycrystalline silicon transistor.

A display device which includes the aforementioned display substrate is also provided in the present disclosure. The display device may be any product or component with a display function, such as a mobile phone, a tablet computer, a television, a display, a laptop computer, a digital photo frame, and a navigator, which is not limited in the embodiments of the present invention.

Although implementations disclosed in the present disclosure are described as above, the described contents are only implementations which are used for facilitating understanding of the present disclosure, but are not intended to limit the present invention. Any skilled person in the art to which the present disclosure pertains may make any modification and variation in a form and details of implementation without departing from the spirit and scope of the present disclosure. However, the patent protection scope of the present invention should be subject to the scope defined in the appended claims.

The invention claimed is:

1. A display substrate, comprising a plurality of circuit units forming a plurality of unit rows and a plurality of unit columns, wherein at least one circuit unit comprises a pixel driving circuit, the pixel driving circuit at least comprises a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor;

a first electrode of the first transistor is connected to a first initial signal line, a second electrode of the first transistor is connected to a first electrode of the second transistor, a gate electrode of the third transistor, and a first end of the first storage capacitor;

a first electrode of the fourth transistor is connected to a data signal line, a second electrode of the fourth transistor is connected to a second electrode of the ninth transistor, a second end of the first storage capacitor, and a second end of the second storage capacitor;

a first electrode of the ninth transistor is connected to a first reference signal line;

a first end of the second storage capacitor is connected to a first power supply line; and the first transistor, the second transistor, the fourth transistor, and the ninth transistor are oxide transistors, and the third transistor is a low-temperature polycrystalline silicon transistor.

2. The display substrate according to claim 1, wherein the first transistor at least comprises a first top gate electrode and a first bottom gate electrode, an orthographic projection of the first top gate electrode on a plane of the display substrate at least partially overlaps with an orthographic projection of the first bottom gate electrode on the plane of the display substrate; and the first top gate electrode is in a shape of a strip extending in a unit row direction, and the first electrode of the first transistor and the second electrode of the first transistor are located on two sides of the first top gate electrode in a unit column direction.

3. The display substrate according to claim 1, wherein the second transistor at least comprises a second top gate electrode and a second bottom gate electrode, an orthographic projection of the second top gate electrode on the plane of the display substrate at least partially overlaps with an orthographic projection of the second bottom gate electrode on the plane of the display substrate; and the second top gate electrode is in a shape of a strip extending in the unit column direction, and the first electrode of the second transistor and a second electrode of the second transistor are located on two sides of the second top gate electrode in the unit row direction.

4. The display substrate according to claim 3, wherein the display substrate further comprises a fifth scan signal line and a fifth scan connection line, the second top gate electrode is connected to the fifth scan signal line, the second bottom gate electrode is connected to the fifth scan connection line, an orthographic projection of the fifth scan signal line on the plane of the display substrate at least partially overlaps with an orthographic projection of the fifth scan connection line on the plane of the display substrate, and the fifth scan signal line is connected to the fifth scan connection line through a via to form a scan signal line having a double-layer structure.

5. The display substrate according to claim 1, wherein the fourth transistor at least comprises a fourth top gate electrode and a fourth bottom gate electrode, an orthographic projection of the fourth top gate electrode on the plane of the display substrate at least partially overlaps with an orthographic projection of the fourth bottom gate electrode on the plane of the display substrate; and the fourth top gate electrode is in a shape of a strip extending in the unit column direction, and the first electrode of the fourth transistor and the second electrode of the fourth transistor are located on two sides of the fourth top gate electrode in the unit row direction.

6. The display substrate according to claim 1, wherein the ninth transistor at least comprises a ninth top gate electrode and a ninth bottom gate electrode, an orthographic projection of the ninth top gate electrode on the plane of the display substrate at least partially overlaps with an orthographic projection of the ninth bottom gate electrode on the plane of the display substrate;

the ninth top gate electrode is in a shape of a strip extending in the unit column direction, and the first electrode of the ninth transistor and the second electrode of the ninth transistor are located on two sides of the ninth top gate electrode in the unit row direction.

7. The display substrate according to claim 6, wherein the display substrate further comprises a second scan signal line and a second scan connection line, the ninth top gate electrode is connected to the second scan signal line, the ninth bottom gate electrode is connected to the second scan connection line, an orthographic projection of the second scan signal line on the plane of the display substrate at least partially overlaps with an orthographic projection of the second scan connection line on the plane of the display substrate, and the second scan signal line is connected to the second scan connection line through a via to form a scan signal line having a double-layer structure.

8. The display substrate according to claim 1, wherein a channel region of the fourth transistor and a channel region of the ninth transistor are on a same straight line extending in the unit row direction.

9. The display substrate according to claim 1, wherein the first storage capacitor at least comprises a first electrode plate and a third electrode plate, an orthographic projection of the first electrode plate on the plane of the display substrate at least partially overlaps with an orthographic projection of the third electrode plate on the plane of the display substrate;

the second storage capacitor at least comprises a second electrode plate and a fourth electrode plate, an orthographic projection of the second electrode plate on the plane of the display substrate at least partially overlaps with an orthographic projection of the fourth electrode plate on the plane of the display substrate; and the first electrode plate serves as the gate electrode of the third transistor, the second electrode plate is connected to the third electrode plate, and the fourth electrode plate is connected to the first power supply line.

10. The display substrate according to claim 9, wherein in a direction perpendicular to the display substrate, at least one circuit unit comprises a first conductive layer, a second conductive layer, a third conductive layer, a fourth conductive layer, and a fifth conductive layer that are sequentially disposed on a base substrate in a direction away from the base substrate;

the first electrode plate and the second electrode plate are disposed in the first conductive layer, the third electrode plate and the fourth electrode plate are disposed in the second conductive layer, the second electrode plate is connected to the third electrode plate through a connection electrode disposed in the fourth conductive layer, and the first power supply line is disposed in the fifth conductive layer.

11. The display substrate according to claim 10, wherein an electrode plate connection line is provided on a side of the fourth electrode plate in the unit row direction, a first end of the electrode plate connection line is connected to the fourth electrode plate of the present circuit unit, and a second end of the electrode plate connection line extends in the unit row direction to be connected to the fourth electrode plate of an adjacent circuit unit, so that the fourth electrode plates of adjacent circuit units in a unit row are connected to each other to form a power supply connection line extending in the unit row direction.

12. The display substrate according to claim 11, wherein two fourth electrode plates adjacent in the unit row direction and the electrode plate connection line form a first groove recessed in a direction away from the third electrode plate, a side of the third electrode plate close to the fourth electrode plate is provided with an electrode plate connection block, the electrode plate connection block is disposed in the first groove, and an end portion of the electrode plate connection block away from the third electrode plate is connected to the connection electrode through a via.

13. The display substrate according to claim 1, wherein the display substrate further comprises at least one first power supply connection line extending in the unit row direction and at least one reference connection line extending in the unit column direction;

the first power supply line is in a shape of a line extending in the unit column direction, and the first power supply line is connected to the first power supply connection line to form a mesh structure for transmitting a first power supply signal; and the first reference signal line is in a shape of a line extending in the unit row direction, and the first reference signal line is connected to the reference connection line to form a mesh structure for transmitting a reference signal.

14. The display substrate according to claim 13, wherein the display substrate further comprises at least one second power supply connection line extending in the unit row direction and at least one second power supply line extending in the unit column direction, and the second power supply line is connected to the second power supply connection line to form a mesh structure for transmitting a second power supply signal.

15. The display substrate according to claim 13, wherein at least one circuit unit further comprises a first connection electrode and a first shielding block, the first connection electrode is connected to the second electrode of the first transistor, the first electrode of the second transistor, and the first end of the first storage capacitor, the first shielding block is connected to the first power supply line, and an orthographic projection of the first shielding block on the plane of the display substrate at least partially overlaps with an orthographic projection of the first connection electrode on the plane of the display substrate.

16. The display substrate according to claim 13, wherein at least one circuit unit further comprises a second connection electrode and a second shielding block, the second connection electrode is connected to the second electrode of the fourth transistor, the second electrode of the ninth transistor, the second end of the first storage capacitor, and the second end of the second storage capacitor, the second shielding block is connected to the first power supply line, and an orthographic projection of the second shielding block on the plane of the display substrate at least partially overlaps with an orthographic projection of the second connection electrode on the plane of the display substrate.

17. The display substrate according to claim 13, wherein at least one circuit unit further comprises a third shielding block connected to the first power supply line, an orthographic projection of the third shielding block on the plane of the display substrate at least partially overlaps with an orthographic projection of the fourth transistor on the plane of the display substrate, and the orthographic projection of the third shielding block on the plane of the display substrate at least partially overlaps with an orthographic projection of the ninth transistor on the plane of the display substrate.

18. A display device, comprising the display substrate according to claim 1.

19. A manufacturing method for a display substrate, the display substrate comprising a plurality of circuit units forming a plurality of unit rows and a plurality of unit columns; the manufacturing method comprising:

forming a pixel driving circuit in at least one circuit unit, wherein the pixel driving circuit at least comprises a first transistor as an initialization transistor, a second transistor as a compensation transistor, a third transistor as a driving transistor, a fourth transistor as a data writing transistor, a ninth transistor as a reference transistor, a first storage capacitor, and a second storage capacitor; a first electrode of the first transistor is connected to a first initial signal line, a second electrode of the first transistor is connected to a first electrode of the second transistor, a gate electrode of the third transistor, and a first end of the first storage capacitor; a first electrode of the fourth transistor is connected to a data signal line, a second electrode of the fourth transistor is connected to a second electrode of the ninth transistor, a second end of the first storage capacitor, and a second end of the second storage capacitor; a first electrode of the ninth transistor is connected to a first reference signal line; and a first end of the second storage capacitor is connected to a first power supply line; the first transistor, the second transistor, the fourth transistor, and the ninth transistor are oxide transistors, and the third transistor is a low-temperature polycrystalline silicon transistor.

\* \* \* \* \*